(12) United States Patent
Lou et al.

(10) Patent No.: US 10,395,615 B2
(45) Date of Patent: Aug. 27, 2019

(54) DISPLAY PANEL AND METHOD FOR MANUFACTURING THE SAME CROSS-REFERENCES TO RELATED APPLICATIONS

(71) Applicants: SHANGHAI TIANMA MICRO-ELECTRONICS CO., LTD., Shanghai (CN); TIANMA MICRO-ELECTRONICS CO., LTD, Shenzhen (CN)

(72) Inventors: Junhui Lou, Shanghai (CN); Yong Wu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 108 days.

(21) Appl. No.: 15/363,200

(22) Filed: Nov. 29, 2016

(65) Prior Publication Data

US 2017/0076687 A1 Mar. 16, 2017

Related U.S. Application Data

(63) Continuation-in-part of application No. 14/743,939, filed on Jun. 18, 2015, now Pat. No. 9,535,294.

(30) Foreign Application Priority Data

Dec. 25, 2014 (CN) .......................... 2014 1 0838361

(51) Int. Cl.
*G09G 3/36* (2006.01)
*G02F 1/1339* (2006.01)
(Continued)

(52) U.S. Cl.
CPC ......... *G09G 3/3677* (2013.01); *G02F 1/1339* (2013.01); *G02F 1/13452* (2013.01);
(Continued)

(58) Field of Classification Search
CPC .. G09G 3/3677; G09G 3/3225; G09G 3/3266; G09G 2300/0408; G02F 1/1339;
(Continued)

(56) References Cited

U.S. PATENT DOCUMENTS

2010/0295033 A1* 11/2010 Rokuhara ........... H01L 27/3246
257/40
2014/0042406 A1 2/2014 Degner et al.
(Continued)

FOREIGN PATENT DOCUMENTS

CN 104009044 A 8/2014

*Primary Examiner* — Vinh T Lam
(74) *Attorney, Agent, or Firm* — Alston & Bird LLP

(57) ABSTRACT

A display panel is disclosed. The display panel includes a first display substrate, where the first display substrate includes a substrate and a flexible thin film, where the flexible thin film includes a first area covering the substrate entirely, and a second area beyond the substrate. In addition, a first circuit is disposed on the first area, and a second circuit is disposed on the second area. By covering the first display substrate with the flexible thin film, the second circuit on the flexible thin film could be bent, so that the border of the display screen could be narrowed without being limited by the requisite size of the peripheral circuit, thus narrowing the border of the display screen and improving the ration in area of the display screen to thereby accommodate the consumer demand for a wider liquid crystal display screen.

13 Claims, 18 Drawing Sheets

(51) Int. Cl.
*G02F 1/1345* (2006.01)
*G09G 3/3225* (2016.01)
*G09G 3/3266* (2016.01)
*H01L 27/32* (2006.01)
*H01L 51/00* (2006.01)
*H01L 51/52* (2006.01)
*H01L 51/56* (2006.01)

(52) U.S. Cl.
CPC ......... *G09G 3/3225* (2013.01); *G09G 3/3266* (2013.01); *H01L 27/3276* (2013.01); *H01L 51/0097* (2013.01); *H01L 51/5246* (2013.01); *H01L 51/5253* (2013.01); *H01L 51/56* (2013.01); *G09G 2300/0408* (2013.01)

(58) Field of Classification Search
CPC ............. G02F 1/13452; H01L 51/0097; H01L 51/5253; H01L 27/3276; H01L 51/5246; H01L 51/56
See application file for complete search history.

(56) References Cited

U.S. PATENT DOCUMENTS

| | | | |
|---|---|---|---|
| 2014/0049500 A1 | 2/2014 | Chen et al. | |
| 2014/0049742 A1 | 2/2014 | Misono | |
| 2014/0054569 A1* | 2/2014 | Roh | H01L 51/5246 257/40 |
| 2016/0181346 A1* | 6/2016 | Kwon | H01L 27/3276 257/40 |
| 2016/0276619 A1* | 9/2016 | Cheng | H01L 51/56 |
| 2016/0293881 A1* | 10/2016 | Wang | H01L 51/0024 |
| 2017/0317309 A1* | 11/2017 | Yang | H05K 5/0086 |

* cited by examiner

DISPLAY PANEL AND METHOD FOR MANUFACTURING THE SAME CROSS-REFERENCES TO RELATED APPLICATIONS

CROSS-REFERENCES TO RELATED APPLICATIONS

This application is a continuation-in-part of the U.S. application Ser. No. 14/743,939, filed on Jun. 18, 2015, which claims priority to Chinese patent application No. 201410838361.3, filed with the Chinese Patent Office on Dec. 25, 2014, the content of which is incorporated herein by reference in its entirety.

BACKGROUND OF THE INVENTION

The present disclosure relates to the field of displays and particularly to a display panel and a method for manufacturing the same.

Thin Film Transistor-Liquid Crystal Displays (TFT-LCDs) with a high display quality, low power consumption, no radiation and other excellent performances have become predominate in the market along with the development of liquid crystal display technologies. An LCD panel generally includes a color filter substrate, and an array substrate, between which liquid crystals are filled, where the liquid crystals are sealed there around with sealant. With a wider border, the size of the periphery of the LCD panel is larger, the real display area of the display panel is smaller, and a picture is displayed smaller, so the consumer demand for a thinner liquid crystal display panel, and a wider screen cannot be accommodated.

In an existing narrow border design, even with a reduction in width of the border, it may be very difficult to further narrow the border of the liquid crystal display panel due to limitation by the requisite size of a peripheral circuit. Also the peripheral circuit being shrunk extremely due to the narrowed border may result in a degraded charging effect and a lower yield of the circuits.

BRIEF SUMMARY OF THE INVENTION

A display panel and a method for manufacturing the same are provided according to embodiments of the disclosure.

One inventive aspect is a display panel. The display panel includes a first display substrate. The first display substrate includes a substrate and a flexible thin film, where the flexible thin film includes a first area entirely covering the substrate, and a second area beyond the substrate. In addition, a first circuit is disposed on the first area, and a second circuit is disposed on the second area.

Another inventive aspect is a method for manufacturing a display panel. The method includes preparing a first substrate, which includes a first area and a second area, and fabricating a flexible thin film on the first substrate to cover the first substrate entirely, namely cover the first area and the second area of the first substrate. The method also includes fabricating a first circuit on the first area and a second circuit on the second area. The method also includes removing the second area of the first substrate to obtain a first display substrate, where the first display substrate includes a substrate and the flexible thin film, where the flexible thin film includes a first area entirely covering the substrate, and a second area beyond the substrate.

In the display panel and the method for manufacturing the same according to the embodiments above, the display panel includes a first display substrate; the first display substrate includes a substrate and a flexible thin film; where the flexible thin film includes a first area entirely covering the substrate and a second area beyond the substrate; and a first circuit is disposed on the first area, and a second circuit is disposed on the second area; so that the second circuit on the flexible thin film can be bent, and further a border of the display panel can be narrowed without being limited by the requisite size of the peripheral circuit, thus narrowing the border of the display panel and enlarging the display screen to thereby accommodate the consumer demand for a wider screen on the liquid crystal display device.

BRIEF DESCRIPTION OF THE DRAWINGS

In order to make the technical solutions according to the embodiments of the disclosure more apparent, the drawings to which reference is made in the description of the embodiments will be described below briefly, and apparently the drawings in the following description are merely illustrative some of the embodiments of the disclosure, and those ordinarily skilled in the art can further derive from these drawings other drawings without any inventive effort.

DETAILED DESCRIPTION OF THE INVENTION

In order to make the objects, technical solutions and advantages of the disclosure more apparent, the disclosure will be described below in further details with reference to the drawings, and evidently the embodiments described here are merely a part but not all of the embodiments of the disclosure. Based upon the embodiments according to the disclosure, all the other embodiments which can occur to those ordinarily skilled in the art without any inventive effort shall fall into the claimed scope of the disclosure.

Figure 1:
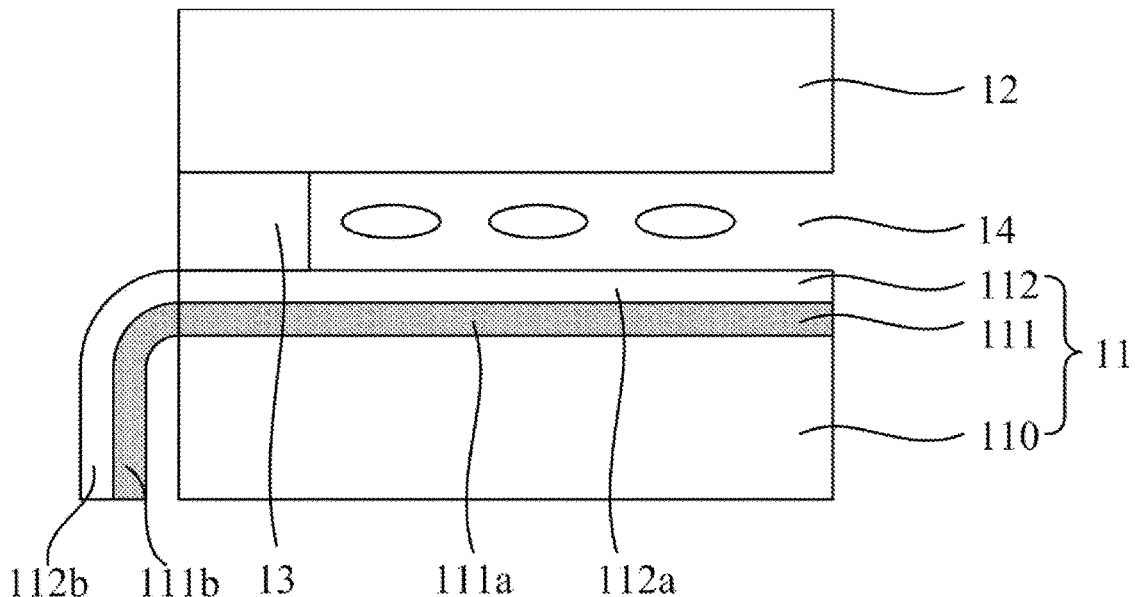
FIG. 1 illustrates a schematic structural diagram of a display panel according to an embodiment of the disclosure in a sectional view.

FIG. 1 illustrates a schematic structural diagram of a display panel according to an embodiment of the disclosure in a sectional view.

As illustrated in FIG. 1, the display panel may include a first display substrate 11, and an opposite substrate 12, between which a sealing material 13 is disposed with a sealed area being a display area, where the first display substrate 11 includes a substrate 110, and a flexible thin film 111 including a first area 111a covering the display area entirely, and a second area 111b beyond the substrate 110; and a first circuit 112a is disposed on the first area 111a, and a second circuit 112b is disposed on the second area 111b. The first circuit 112a and the second circuit 112b constitute a circuit 112, where the first circuit 112a disposed on the first area 111a is a pixel circuit, and the second circuit 112b disposed on the second area 111b is a peripheral circuit. Particularly the pixel circuit disposed on the first area 111a is an array of pixels. The peripheral circuit disposed on the second area 111b may be an Amorphous Silicon Gate Driver (ASG) circuit or a poly-silicon gate driving circuit or may be an electrode wire circuit or an integrated control circuit.

Moreover it shall be noted that the display panel according to this embodiment is a liquid crystal display panel, the first display substrate 11 is an array substrate, the opposite substrate 12 is a color filter substrate, and a liquid crystal layer 14 is disposed between the array substrate and the color filter substrate. However in some other embodiments of the disclosure, alternatively the display panel may be an organic light-emitting display panel, the first display substrate may be an array substrate, and the opposite substrate may be a protection cap substrate or another substrate, but the disclosure will not be limited to this embodiment described here.

Figure 2:
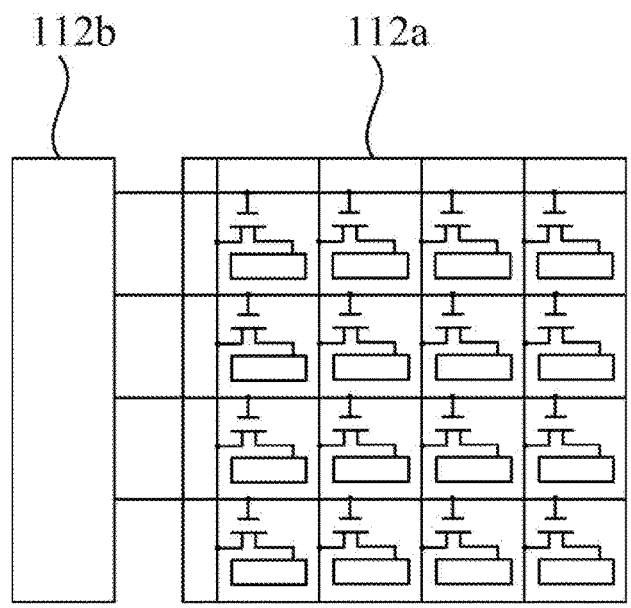
FIG. 2 illustrates a schematic structural diagram of a first area and a second area in the display panel according to the embodiment of the disclosure in a top view.

In the liquid crystal display panel according to the embodiment above, referring to FIG. 2 which is a schematic structural diagram of the first circuit 112a disposed on the first area 111a as a pixel circuit, and the second circuit 112b disposed on the second area 111b as a peripheral circuit in a top view, FIG. 2 illustrates a schematic structural diagram of the first area 111a and the second area 111b in the display panel according to the embodiment of the disclosure in a top view. It shall be noted that FIG. 2 illustrates another state than the state in which the flexible thin film 11 is bent, but the disclosure will not be limited to the state illustrated in FIG. 2 in a real implementation. As illustrated in FIG. 2, 112a refers to a pixel circuit disposed on the first area 111a and 112b refers to a peripheral circuit disposed on the second area 111b in FIG. 1.

Correspondingly an embodiment of the disclosure provides an array substrate including a transparent rigid substrate and a flexible thin film, where the flexible thin film includes a first area covering the display area entirely, and a second area beyond the transparent rigid substrate; and the first area is disposed on the transparent rigid substrate, an array of pixels is disposed on the first area, and a peripheral circuit is disposed on the second area.

In the display panel according to this embodiment, the sealing material 13 is in the shape of closed loop, and the substrate 110 is correspondingly in the shape of rectangle. Three edges of the substrate 110 of the first display substrate 11 are aligned with outer edges of the sealing material 13. This structure is adopted due to a step in the substrate 110 of the first display substrate 11, where connection terminals connecting an external circuit with a display panel circuit are disposed on the step only on the edge where the step is located, so that the other edges can be aligned with the outer edges of the sealing material 13 to thereby narrow the border of the display panel and improve the screen occupation ratio. It shall be noted that in order to cut the array substrate flexibly at a lower labor cost, the edges of the first display substrate 11 may or may not be aligned with the outer edges of the sealing material 13. In some other embodiments of the disclosure, the substrate of the first display substrate may include four edges around the substrate, at least one of which is aligned with the outer edge of the sealing material, and this structure can be adopted to thereby save process steps in the manufacturing process so as to improve the manufacturing efficiency and lower the cost.

Moreover in this embodiment, edges of the opposite substrate 12 are aligned with the outer edges of the sealing material. In this embodiment, the opposite substrate 12 is a color filter substrate on which typically no driving circuits or pixel circuits or other circuits are disposed. The edges of the opposite substrate 12 may be aligned with the outer edges of the sealing material to thereby minimize the width of the border of the display panel and maximize screen occupation ratio so as to improve the display effect.

In order to decrease the width of a border of a display device including the display panel above to thereby narrow the border of the liquid crystal display including the display panel above, the flexible thin film in the second area 111b is bent to be fitted onto the side of the display panel.

In order to facilitate bending of the flexible thin film in the second area 111b and the display effect of the display panel, the flexible thin film in the second area 111b is bent toward the side of the display panel in the direction, in which the first display substrate 11, i.e., the array substrate, lies, i.e., toward the side of the array substrate.

Figure 3:
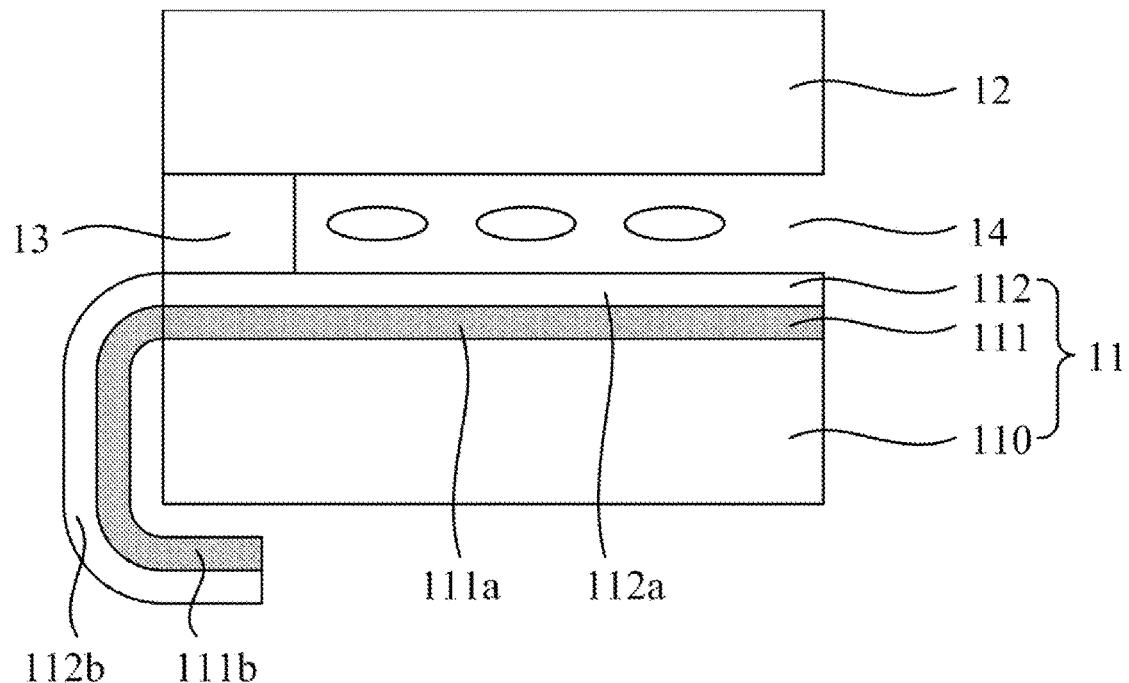
FIG. 3 illustrates a schematic structural diagram of another display panel according to an embodiment of the disclosure in a sectional view.

In a particular implementation, if the length of the flexible thin film 111 in the second area 111b goes beyond the thickness of the substrate 110 in the first display substrate 11, then the part thereof beyond the thickness may be bent to be fitted onto the surface of the first display substrate 11 away from the opposite substrate 12. Further to the liquid crystal display panel according to the embodiment above, the disclosure further provides an embodiment of another liquid crystal display panel as follows:

FIG. 3 illustrates a schematic structural diagram of another liquid crystal display panel according to an embodiment of the disclosure in a sectional view.

As illustrated in FIG. 3, the liquid crystal display panel may include a first display substrate 11, and an opposite substrate 12, between which a sealing material 13 is disposed with a sealed area being a display area. Particularly in this embodiment, the first display substrate 11 is an array substrate, the opposite substrate 12 is a color filter substrate, the first display substrate 11 is disposed opposite to the opposite substrate 12, and a liquid crystal layer 14 is filled in the area sealed by the sealing material 13, where the first display substrate 11, i.e., the array substrate, includes a substrate 110, and a flexible thin film 111 including a first area 111a covering the display area entirely, and a second area 111b, beyond the substrate 110, bent to be fitted onto the surface of the first display substrate 11, i.e., the array substrate, away from the opposite substrate 12, i.e., the color filter substrate; and a first circuit 112a is disposed on the first area 111a, and a second circuit 112b is disposed on the second area 111b; and where the first circuit 112a disposed on the first area 111a is a pixel circuit, and the second circuit 112b disposed on the second area 111b is a peripheral circuit. Particularly the pixel circuit disposed on the first area 111a is an array of pixels.

It shall be noted that in order to avoid an influence of the peripheral circuit 112b disposed in the second area 111b upon the display area surrounded by the sealing material, the width of the second area 111b bent to be fitted onto the surface of the first display substrate 11 away from the opposite substrate 12 shall not be larger than the width of the sealing material 13 in this embodiment.

In order to facilitate detection of a circuit failure in the second area, the bent flexible thin film in the second area may further be fixed and protected, for example, the bent flexible thin film in the second area may be fixed by a transparent adhesive tape, a polyimide (PI) adhesive, etc. After the bent flexible thin film in the second area is fixed, the bent flexible thin film in the second area may further be protected by an Optic Clear (OC) adhesive, an ultraviolet cured adhesive, a thermally cured adhesive, etc. Particularly when the protected second circuit in the second area fails, if the bent flexible thin film in the second area is protected by an OC adhesive, then the failing circuit may be identified directly to thereby defect the failure.

Preferably in order to improve the transmissivity of the display pane and facilitate fabrication of the pixel circuit and the peripheral circuit on the first display substrate 11, the transmissivity of the flexible thin film 111 is higher than 90%, and the highest endurable temperature thereof is not lower than 200° C.

The liquid crystal display panel according to the embodiment above includes a first display substrate, and an opposite substrate, disposed opposite to each other; the first display substrate includes a substrate, and a flexible thin film including a first area covering the display area entirely, and a second area beyond the substrate; and first circuit is disposed on the first area, a second circuit is disposed on the second area, and the first display substrate is covered with a flexible thin film, so that the second circuit on the flexible thin film can be bent, and further the border of the display screen can be narrowed without being limited by the requisite size of the peripheral circuit, thus narrowing the border of the display screen and enlarging the display screen to thereby accommodate the consumer demand for a wider liquid crystal display screen. In the meanwhile, the peripheral circuit can further be made larger to thereby improve the charging effect and improve the yield of the product. Moreover the bent flexible thin film in the second area can further be fixed and protected to thereby facilitate detection of a failure of the circuit in the second area.

Figure 4:
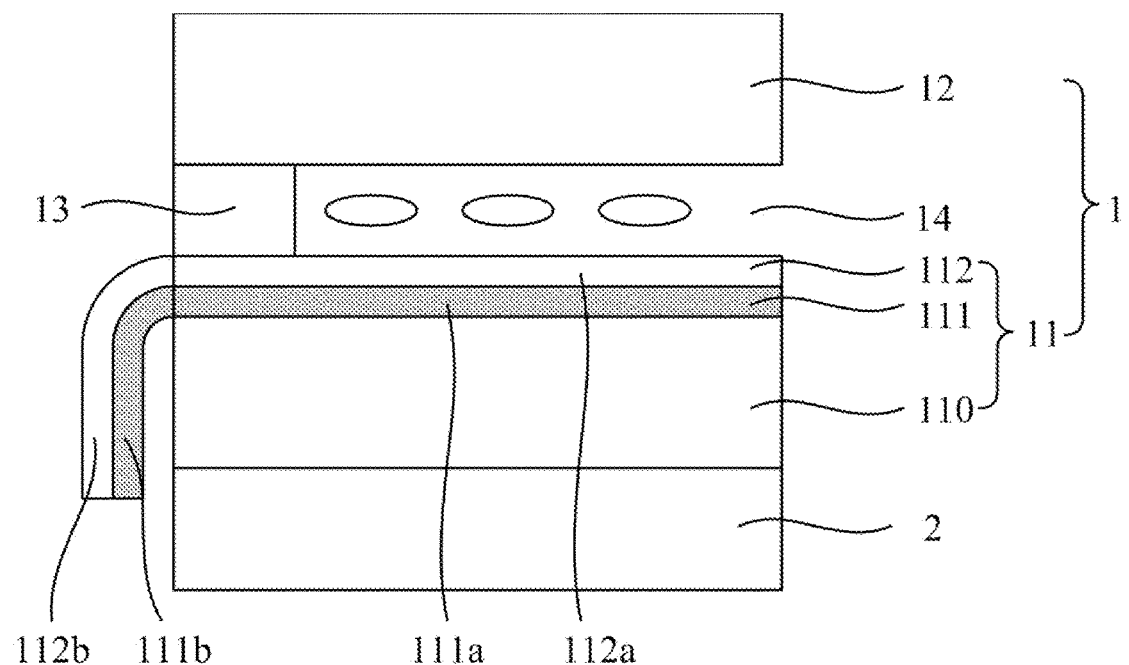
FIG. 4 illustrates a schematic structural diagram of a display device according to an embodiment of the disclosure in a sectional view.

An embodiment of the disclosure further provides a display device. FIG. 4 illustrates a schematic structural diagram of a display device according to an embodiment of the disclosure in a sectional view. As illustrated in FIG. 4, the display device may include a display panel (device) 1 according to the embodiment above, and a backlight module 2.

Particularly the display panel 1 includes a first display substrate 11, and an opposite substrate 12, disposed opposite to each other, and the backlight module 2 is disposed on the first display substrate surface of the display panel. It shall be noted that this embodiment will be described taking a liquid crystal display as an example, that is, the display panel 1 is a liquid crystal display panel, the first display substrate 11 is an array substrate, the opposite substrate 12 is a color filter substrate, and a liquid crystal layer is interposed between the array substrate and the color filter substrate.

Particularly the surface of the first display substrate 11 facing the opposite substrate 12 is a front surface, and the surface thereof away from the opposite substrate 12 is a back surface. The backlight module 2 is typically disposed on the back surface of the first display substrate 11, i.e., the surface of the array substrate away from the color filter substrate.

In order to narrow the border of the liquid crystal display to thereby increase the area of the display area so as to accommodate the consumer demand for a wider liquid crystal display screen, the first display substrate 11 includes a substrate 110, and a flexible thin film 111 including a first area 111a covering the display area entirely, and a second area 111b beyond the substrate 110. The flexible thin film in the second area 111b is bent to be fitted onto the sides of the first display substrate 11 and the backlight module 2; and a first circuit 112a is disposed on the first area 111a, and a second circuit 112b is disposed on the second area 111b, where the first circuit 112a disposed on the first area 111a is a pixel circuit, and the second circuit 112b disposed on the second area 111b is a peripheral circuit.

Particularly the pixel circuit disposed on the first area 111a is an array of pixels. The peripheral circuit disposed on the second area 111b may be an Amorphous Silicon Gate Driver (ASG) circuit or a poly-silicon gate driving circuit or may be an electrode wire circuit or an integrated control circuit.

In the display panel according to this embodiment, three edges of the substrate 110 of the first display substrate 11 are aligned with outer edges of the sealing material 13. This structure is adopted due to a step in the substrate 110 of the first display substrate 11, where connection terminals connecting an external circuit with a display panel circuit are disposed on the step only on the edge where the step is located, so that the other edges can be aligned with the outer edges of the sealing material 13 to thereby narrow the border of the display panel and improve the screen occupation ratio. It shall be noted that in order to cut the array substrate flexibly at a lower labor cost, the edges of the first display substrate 11 may or may not be aligned with the outer edges of the sealing material 13. In some other embodiments of the disclosure, the substrate of the first display substrate may include four edges around the substrate, at least one of which is aligned with the outer edge of the sealing material, and this structure can be adopted to thereby save process steps in the manufacturing process so as to improve the manufacturing efficiency and lower the cost.

Moreover in this embodiment, edges of the opposite substrate 12 are aligned with the outer edges of the sealing material. In this embodiment, the opposite substrate 12 is a color filter substrate on which typically no driving circuits or pixel circuits or other circuits are disposed, and the edges of the opposite substrate 12 may be aligned with the outer edges of the sealing material to thereby minimize the width of the border of the display panel and maximize screen occupation ratio so as to improve the display effect.

In a particular implementation, if the length of the flexible thin film 111 in the second area 111b goes beyond the thickness of the substrate 110 in the first display substrate 11, and the backlight module 2, then the part thereof beyond the thickness may be bent to be fitted onto the surface of the backlight module 2 away from the first display substrate 11.

Figure 5:
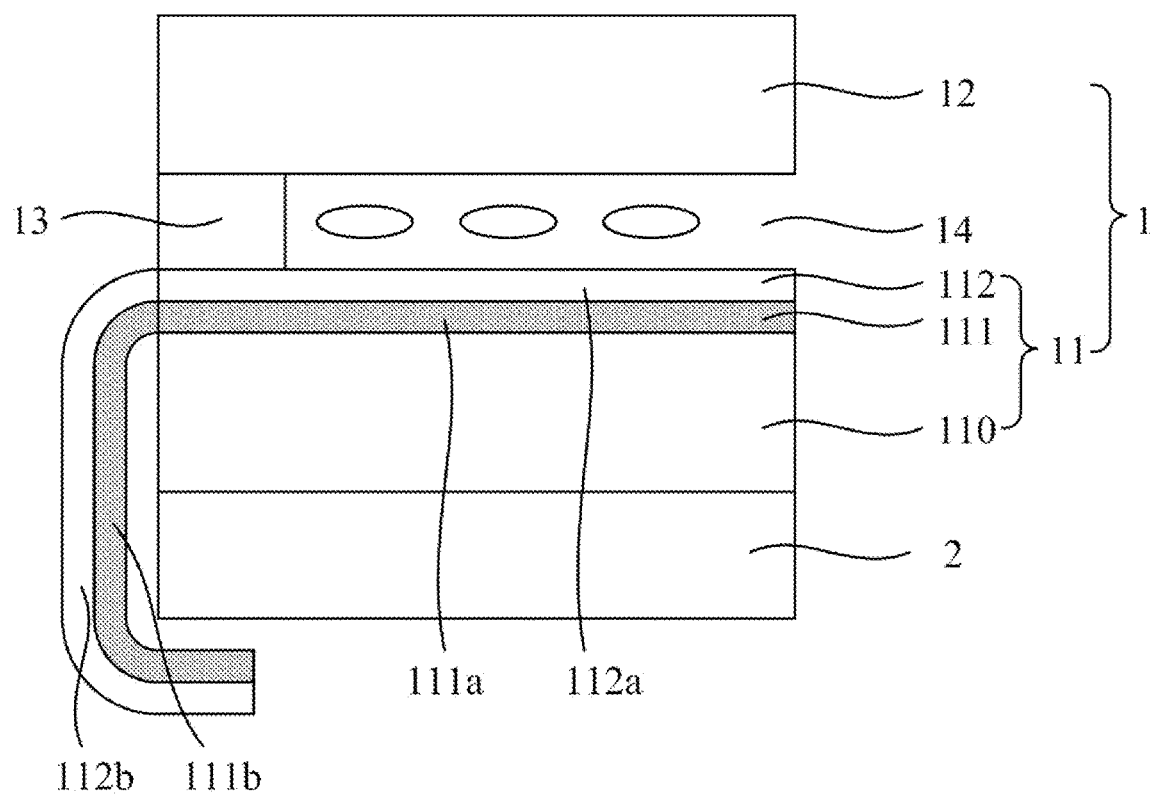
FIG. 5 illustrates a schematic structural diagram of another display device according to an embodiment of the disclosure in a sectional view.

An embodiment of the disclosure further provides a display device. FIG. 5 illustrates a schematic structural diagram of another display device according to an embodiment of the disclosure in a sectional view. As illustrated in FIG. 5, the display device may include a display panel (device) 1 and a backlight module 2.

Particularly the display panel 1 includes a first display substrate 11 and an opposite substrate 12 and the backlight module 2 is disposed on the first display substrate 11 side of the display panel 1, where the display panel 1 is a liquid crystal display panel, the first display substrate 11 is an array substrate, the opposite substrate 12 is a color filter substrate, and a sealing material 13 is interposed between the array substrate and the color filter substrate with a sealed area being a display area in which a liquid crystal layer 14 is filled.

Particularly the surface of the first display substrate 11, i.e., the array substrate, facing the opposite substrate 12, i.e., the color filter substrate, is a front surface, and the surface thereof away from the color filter substrate is a back surface. The backlight module 2 is typically disposed on the back surface of the first display substrate 11.

In order to narrow the border of the display to thereby increase the area of the display area so as to accommodate the consumer demand for a larger ratio in area of the liquid crystal display area, the first display substrate 11 includes a substrate 110, and a flexible thin film 111 including a first area 111a covering the display area entirely, and a second area 111b beyond the substrate 110. The flexible thin film 111 in the second area 111b is bent to be fitted onto the sides of the first display substrate 11 and the backlight module 2; and a first circuit 112a is disposed on the first area 111a, and a second circuit 112b is disposed on the second area 111b, where the first circuit 112a disposed on the first area 111a is a pixel circuit, and the second circuit 112b disposed on the second area 111b is a peripheral circuit.

Particularly the pixel circuit disposed on the first area 111a is an array of pixels. The peripheral circuit disposed on the second area 111b may be an Amorphous Silicon Gate Driver (ASG) circuit or a poly-silicon gate driving circuit or may be an electrode wire circuit or an integrated control circuit. In order to facilitate detection of a failure of the second circuit on the second area, the bent flexible thin film in the second area may further be fixed and protected, for example, the bent flexible thin film in the second area may be fixed by a transparent adhesive tape, a polyimide (PI) adhesive, etc. After the bent flexible thin film in the second area is fixed, the bent flexible thin film in the second area may further be protected by an Optic Clear (OC) adhesive, an ultraviolet cured adhesive, a thermally cured adhesive, etc. Particularly when the protected second circuit on the second area fails, if the bent flexible thin film in the second area is protected by an OC adhesive, then the failing circuit can be identified directly to thereby defect the failure.

Preferably in order to improve transmissivity of the display panel and facilitate fabrication of the pixel circuit and the peripheral circuit on the first display substrate 11, the transmissivity of the flexible thin film 111 is higher than 90%, and the highest endurable temperature thereof is not lower than 200° C.

The display device according to the embodiment above includes the display panel according to the embodiment above, and a backlight module, and the display panel includes an array substrate, and a color filter substrate, disposed opposite to each other, and the backlight module is disposed on the array substrate side of the liquid crystal display panel, so that the flexible thin film in the second area can be bent to be fitted onto the sides of the array substrate and the backlight module, and further the border of the liquid crystal display screen can be narrowed without being limited by the requisite size of the peripheral circuit, thus narrowing the border of the liquid crystal display screen and enlarging the liquid crystal display screen to thereby accommodate the consumer demand for a wider liquid crystal display screen. Moreover the bent flexible thin film in the second area can further be fixed and protected to thereby facilitate detection of a failure of the circuit on the second area.

Based upon the same technical idea, an embodiment of the disclosure provides a method for manufacturing a display panel, which can be applicable to manufacturing of the display panel according to the embodiment above.

Figure 6:
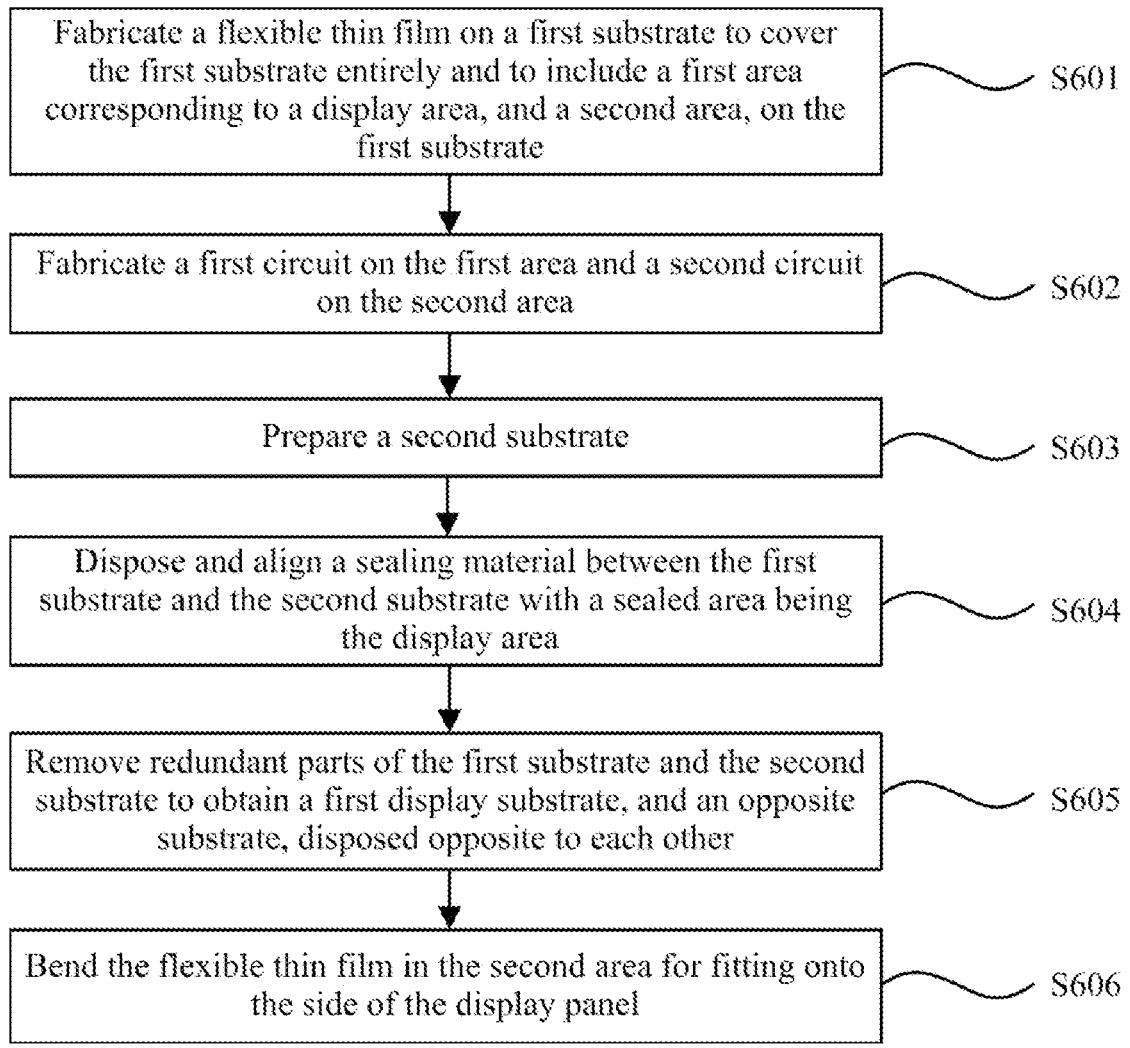
FIG. 6 illustrates a flow chart of a method for manufacturing a display panel according to an embodiment of the disclosure.

FIG. 6 illustrates a flow chart of a method for manufacturing a liquid crystal display panel according to an embodiment of the disclosure, and FIG. 7A to FIG. 7E illustrate schematic structural diagrams during the flow of manufacturing a liquid crystal display panel according to an embodiment of the disclosure in sectional views. Referring to FIG. 6 and FIG. 7A to FIG. 7E, the method may include:

S601 is to prepare a first substrate and fabricate a flexible thin film on the first substrate to cover the first substrate entirely and to include a first area corresponding to a display area, and a second area, on the first substrate.

S602 is to fabricate a first circuit on the first area and a second circuit on the second area.

S603 is to prepare a second substrate.

S604 is to dispose and align a sealing material between the first substrate and the second substrate with a sealed area being the display area.

S605 is to remove excess parts of the first substrate and the second substrate to obtain a first display substrate, and an opposite substrate, disposed opposite to each other, where the first display substrate includes a substrate and a flexible thin film, the second area of the flexible thin film goes correspondingly beyond the area of the substrate, the excess part of the first substrate is the first substrate other than the substrate, and the excess part of the second substrate is the second substrate other than the opposite substrate.

S606 is to bend the flexible thin film in the second area for fitting onto the side of the display panel.

Particularly in order to improve the transmissivity of the display pane and facilitate fabrication of the pixel circuit and the peripheral circuit on the substrate, the transmissivity of the flexible thin film is higher than 90% and the highest endurable temperature thereof is not lower than 200° C. in the step 601.

Figure 7A:
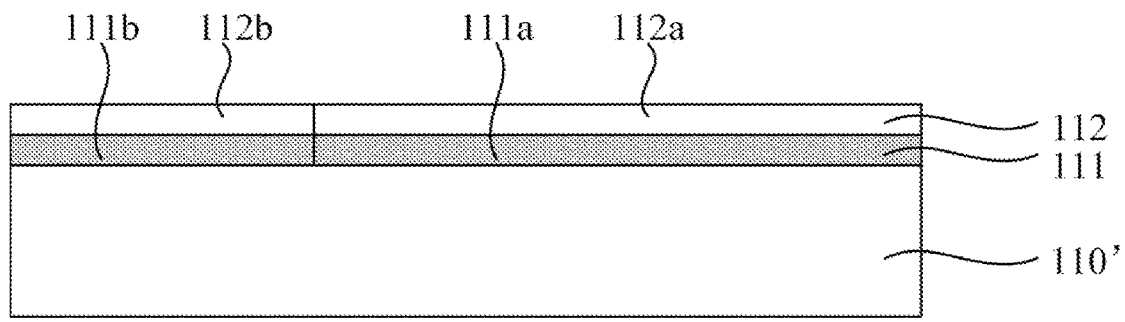
FIG. 7A to FIG. 7E illustrate schematic structural diagrams during the flow of manufacturing a display panel according to an embodiment of the disclosure in sectional views.

Referring to FIG. 6 and FIG. 7A, the step S601 and the step S602 are performed, where the flexible thin film 111 is fabricated on the first substrate 110' to cover the first substrate 110' entirely and to include the first area 111a corresponding to the display area, and the second area 111b, on the first substrate 110', and the first circuit 112a is fabricated on the first area 111a, and the second circuit 112b is fabricated on the second area 111b, where the first circuit 112a and the second circuit 112b are fabricated at the same time, and the first circuit 112a and the second circuit 112b constitute a circuit 112. Referring to FIG. 7A, there is illustrated a schematic structural diagram of the substrate of the display panel including the flexible thin film 111 fabricated on the first substrate 110', and the first circuit 112a fabricated on the first area 111a and the second circuit 112b fabricated on the second area 111b of the flexible thin film 111, according to the embodiment of the disclosure in a sectional view.

Figure 7B:
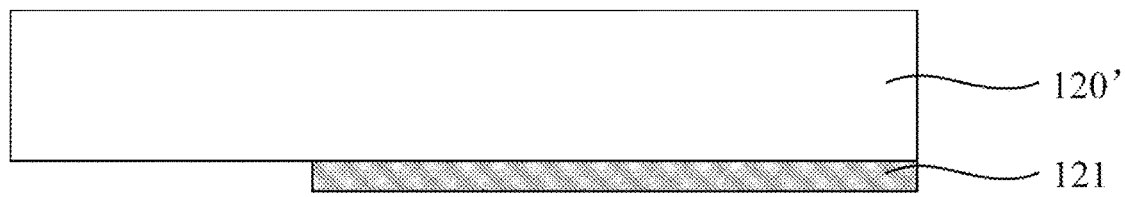

Referring to FIG. 6 and FIG. 7B, the step S603 is performed, where the second substrate 120' is prepared. More particularly in the method for fabricating a liquid crystal display panel according to this embodiment, after the second substrate 120' is prepared, display elements 121 are further fabricated on the second substrate 120', where the display elements 121 correspond to the first area 111a of the flexible thin film 111 on the first substrate 110'. More particularly the display elements 121 on the second substrate 120' are color filter films, black matrixes or other display elements. It shall be noted that this embodiment is only exemplary, but in other embodiments of the disclosure, when the display panel is prepared as another display panel, e.g., an organic light-emitting display panel, the display elements 121 may be organic light-emitting materials or other display elements. The disclosure will not be limited to the steps and structures described in this embodiment.

Figure 7C:
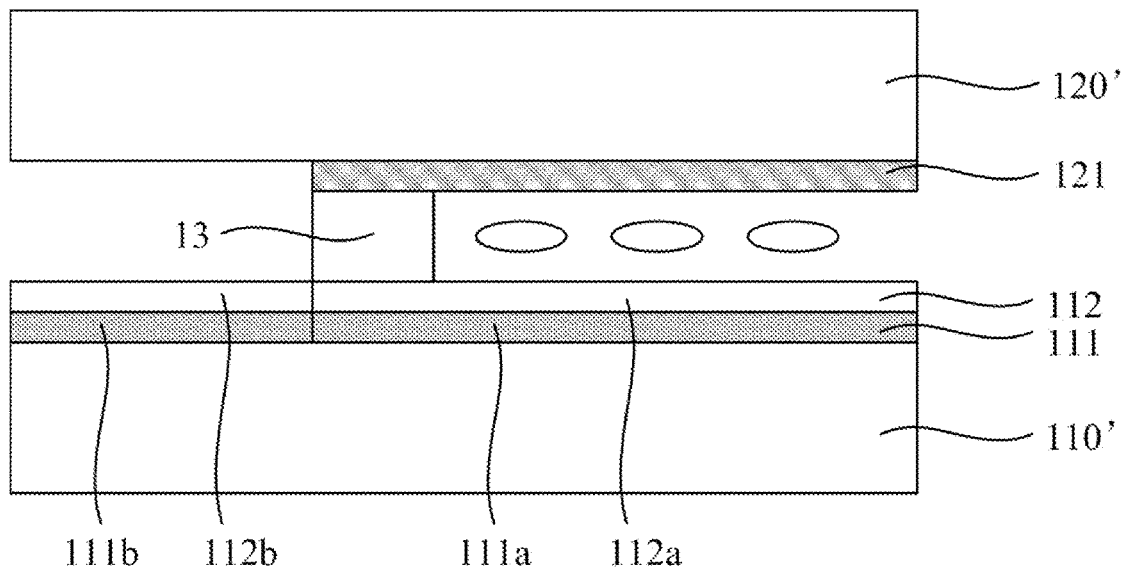

Referring to FIG. 6 and FIG. 7C, the step S604 is performed, where the sealing material 13 is disposed and aligned between the first substrate 110' and the second substrate 120' with the sealed area being the display area. More particularly the liquid crystal layer 14 is filled between the first substrate 110' and the second substrate 120'. Referring to FIG. 7B, there is illustrated a schematic structural diagram of the display panel including the sealing material 13 disposed between the first substrate 110' and the second substrate 120', and the liquid crystal layer 14 filled in the display area in which the sealing material is packaged, according to the embodiment of the disclosure in a sectional view.

Figure 7D:
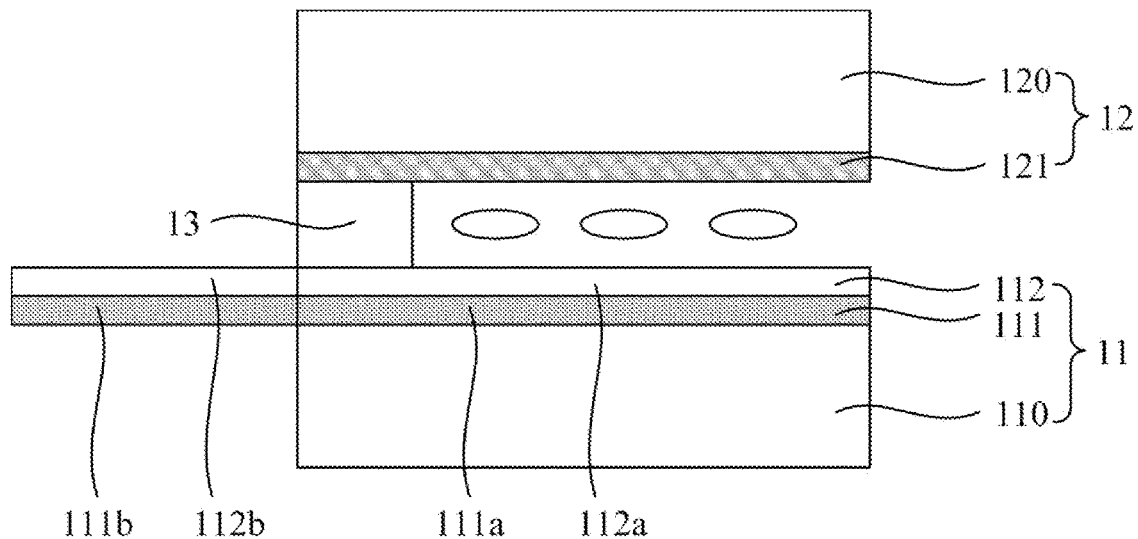

Referring to FIG. 6 and FIG. 7D, the step S605 is performed, where the excess parts of the first substrate and the second substrate are removed to obtain the first display substrate and the opposite substrate. Particularly in the method for fabricating a liquid crystal display panel according to this embodiment, the first display substrate is an array substrate and the opposite substrate is a color filter substrate in this embodiment. Further to the structure of the display panel illustrated in FIG. 7C, the excess parts of the first substrate 110' and the second substrate 120' are removed to form the first display substrate 11, i.e., the array substrate, and the opposite substrate 12, i.e., the color filter substrate, the first display substrate 11 includes the substrate 110, and the flexible thin film 111 covering the entire substrate 110, the second area 111b of the flexible thin film 111 goes correspondingly beyond the area of the substrate 110, the excess part of the first substrate 110' is the first substrate 110' other than the substrate 110, and the excess part of the second substrate 120' is the second substrate 120' other than the opposite substrate 12.

In order to decrease the width of a border of a display device including the liquid crystal display panel above to thereby narrow the border of the liquid crystal display including the liquid crystal display panel above, after the excess parts of the first substrate 110' and the second substrate 120' are removed, the flexible thin film 111 in the second area 111b may further be bent to be fitted onto the side of the liquid crystal display panel, i.e., the side of the array substrate. The flexible thin film 111 in the second area 111b may be bent toward the array substrate or the color filter substrate.

Figure 7E:
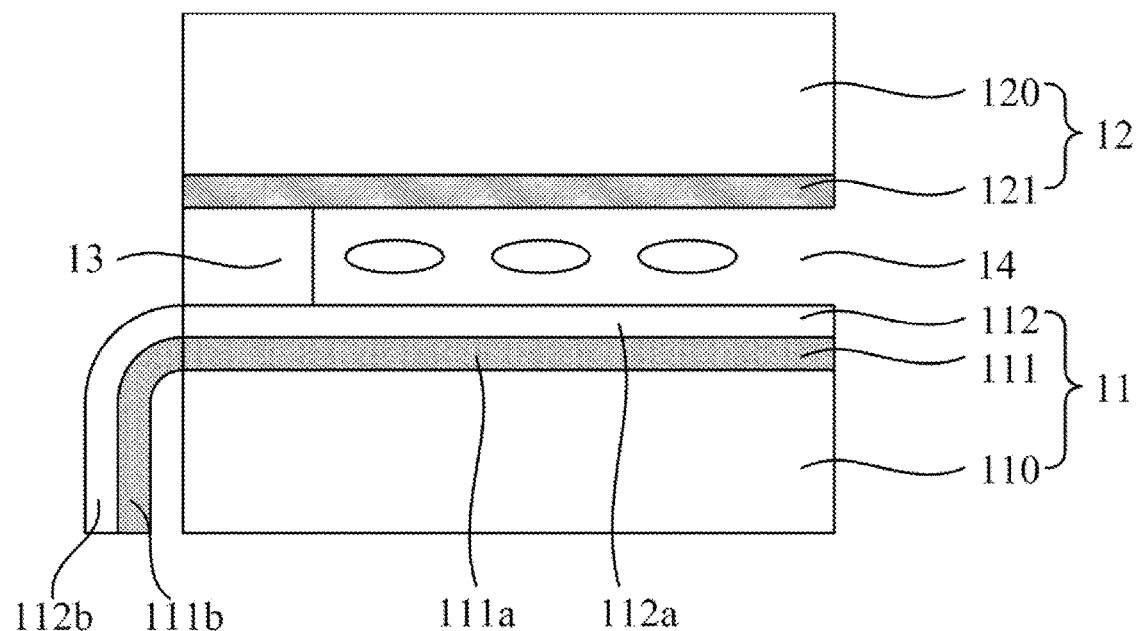

Thus referring to FIG. 6 and FIG. 7E, the step S606 is performed, where further to the structure illustrated in FIG. 7D, the flexible thin film 111 in the second area 111b may be bent to be fitted onto the side of the display panel, i.e., the side of the first substrate 11, i.e., the side of the substrate 110.

More particularly in the step S602, when the first circuit 112a is fabricated on the first area 111a, and the second circuit 112b is fabricated on the second area 111b, the first circuit 112a is an array of pixels, and the second circuit 112b is a peripheral circuit which may be an ASG circuit or a poly-silicon gate driving circuit or may be an electrode wire circuit or an integrated control circuit. Furthermore in order to avoid a degraded characteristic of the flexible thin film, the first circuit and the second circuit shall be fabricated at temperature no higher than the highest endurable temperature of the flexible thin film.

More particularly in S605 of this embodiment, after the excess parts of the first substrate 110' and the second substrate 120' are removed, three edges of the substrate 110 of the first display substrate 11 are aligned with outer edges of the sealing material 13. This structure is adopted due to a step in the substrate 110 of the first display substrate 11, where connection terminals connecting an external circuit with a display panel circuit are disposed on the step only on the edge where the step is located, so that the other edges can be aligned with the outer edges of the sealing material 13 to thereby narrow the border of the display panel and improve the screen occupation ratio. It shall be noted that in order to cut the array substrate flexibly at a lower labor cost, the edges of the first display substrate 11 may or may not be aligned with the outer edges of the sealing material 13. In some other embodiments of the disclosure, the substrate of the first display substrate may include four edges around the substrate, at least one of which is aligned with the outer edge of the sealing material, and this structure can be adopted to thereby save process steps in the manufacturing process so as to improve the manufacturing efficiency and lower the cost.

Moreover in this embodiment, edges of the opposite substrate 12 are aligned with the outer edges of the sealing material. In this embodiment, the opposite substrate 12 is a color filter substrate on which typically no driving circuits or pixel circuits or other circuits are disposed. The edges of the opposite substrate 12 may be aligned with the outer edges of the sealing material to thereby minimize the width of the border of the display panel and maximize screen occupation ratio so as to improve the display effect.

In order to facilitate detection of a failure, the bent flexible thin film in the second area may further be fixed and protected, for example, the bent flexible thin film in the second area may be fixed by a transparent adhesive tape, a polyimide (PI) adhesive, etc. After the bent flexible thin film in the second area is fixed, the bent flexible thin film in the second area may further be protected by an Optic Clear (OC) adhesive, an ultraviolet cured adhesive, a thermally cured adhesive, etc. Particularly when the protected second circuit on the second area fails, if the bent flexible thin film in the second area is protected by an OC adhesive, then the failing circuit can be identified directly to thereby defect the failure.

It shall be noted that after the step S606 of this embodiment, if the length of the flexible thin film 111 in the second area 111b goes beyond the thickness of the substrate 110 in the first display substrate 11, then the part thereof beyond the thickness may be bent to be fitted onto the surface of the first display substrate 11 away from the opposite substrate 12. It shall be noted that in order to avoid an influence of the peripheral circuit 112*b* disposed on the second area 111*b* upon the display area surrounded by the sealing material, the width of the second area 111*b* bent to be fitted onto the surface of the first display substrate 11 away from the opposite substrate 12 shall not be larger than the width of the sealing material 13 in this embodiment.

The method for fabricating a liquid crystal display panel according to this embodiment includes: fabricating a flexible thin film on a first substrate to cover the first substrate entirely and to include a first area corresponding to a display area, and a second area, on the first substrate; fabricating a first circuit on the first area; fabricating a second circuit on the second area; and removing excess parts of the first substrate and the second substrate to obtain a first display substrate and an opposite substrate, where the first display substrate includes a substrate and the flexible thin film, and the second area of the flexible thin film goes correspondingly beyond the area of the substrate, so that the second circuit on the flexible thin film may be bent, and further the border of the liquid crystal display screen can be narrowed without being limited by the requisite size of the peripheral circuit, thus narrowing the border of the display screen and improve the ratio in area of the display panel to thereby accommodate the consumer demand for a wider liquid crystal display screen. Moreover the bent flexible thin film in the second area can further be fixed and protected to thereby facilitate detection of a failure of the circuit on the second area.

Based upon the liquid crystal display according to the embodiment above, an embodiment of the disclosure further provides a method for manufacturing a display device, which can be applicable to manufacturing of the liquid crystal display according to the embodiment above.

Figure 8:
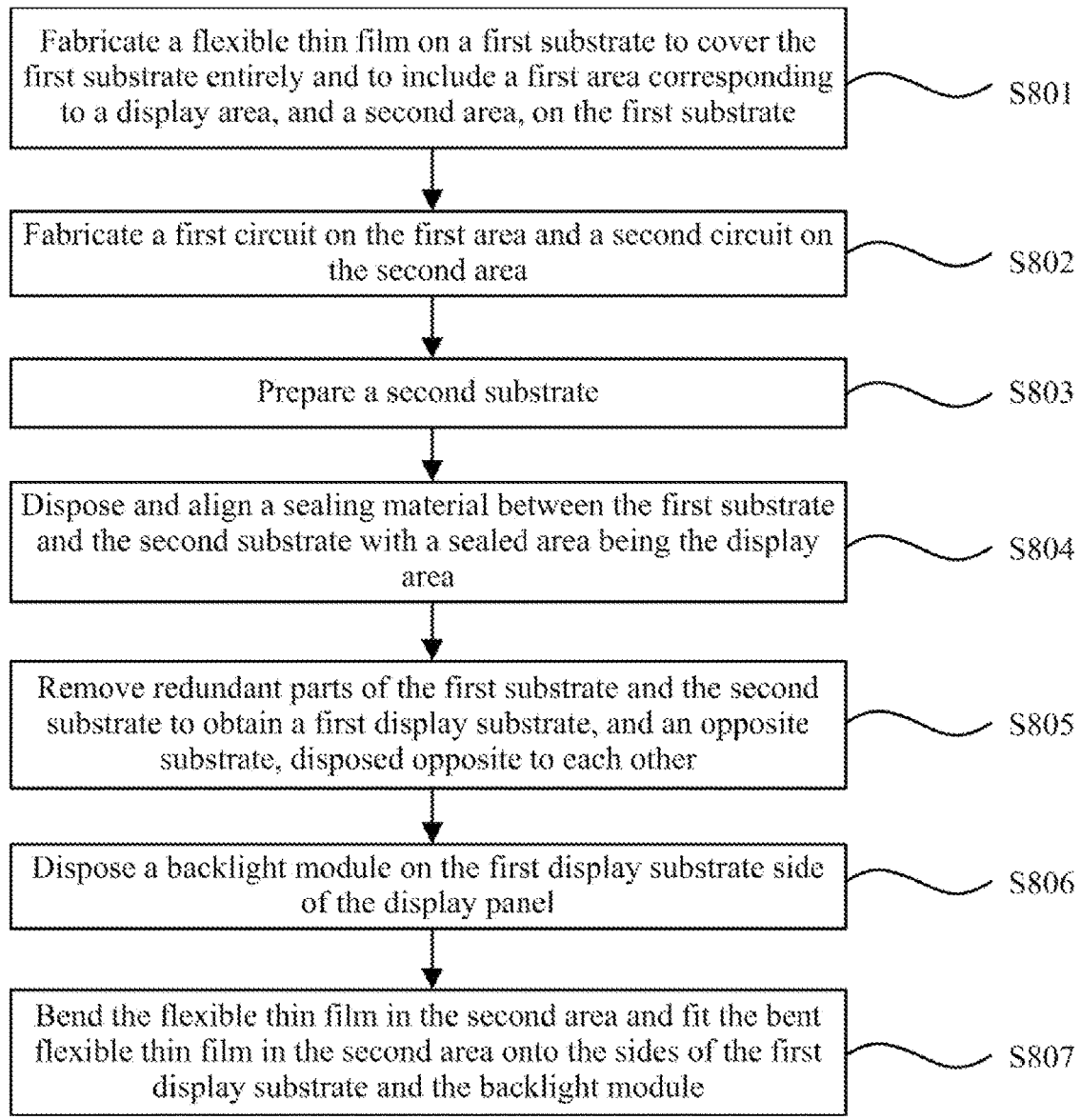
FIG. 8 illustrates a flow chart of a method for manufacturing a display device according to an embodiment of the disclosure.

FIG. 8 illustrates a flow chart of a method for manufacturing a display according to an embodiment of the disclosure, and FIG. 9A to FIG. 9F illustrate schematic structural diagrams of a flow of manufacturing a display device according to an embodiment of the disclosure in sectional views. Referring to FIG. 8 and FIG. 9A to FIG. 9F, the method may include:

S801 is to preparing a first substrate and fabricate a flexible thin film on the first substrate to cover the first substrate entirely and to include a first area corresponding to a display area, and a second area, on the first substrate.

S802 is to fabricate a first circuit on the first area and a second circuit on the second area.

S803 is to prepare a second substrate.

S804 is to dispose and align a sealing material between the first substrate and the second substrate with a sealed area being the display area.

S805 is to remove excess parts of the first substrate and the second substrate to obtain a first display substrate, and an opposite substrate, disposed opposite to each other, where the first display substrate includes a substrate and the flexible thin film, the second area of the flexible thin film goes correspondingly beyond the area of the substrate, the excess part of the first substrate is the first substrate other than the substrate, and the excess part of the second substrate is the second substrate other than the opposite substrate.

S806 is to dispose a backlight module on the first display substrate side of the display panel.

S807 is to bend the flexible thin film in the second area and to fit the bent flexible thin film in the second area onto the sides of the first display substrate and the backlight module.

Particularly in order to improve the transmissivity of the display pane and facilitate fabrication of the pixel circuit and the peripheral circuit on the substrate, preferably the transmissivity of the flexible thin film is preferably higher than 90% and the highest endurable temperature thereof is not lower than 200° C., that is, high temperature to which the flexible thin film 111 is endurable is preferably higher than or equal to 200° C., when the flexible thin film is fabricated on the first substrate in the step 801.

Figure 9A:
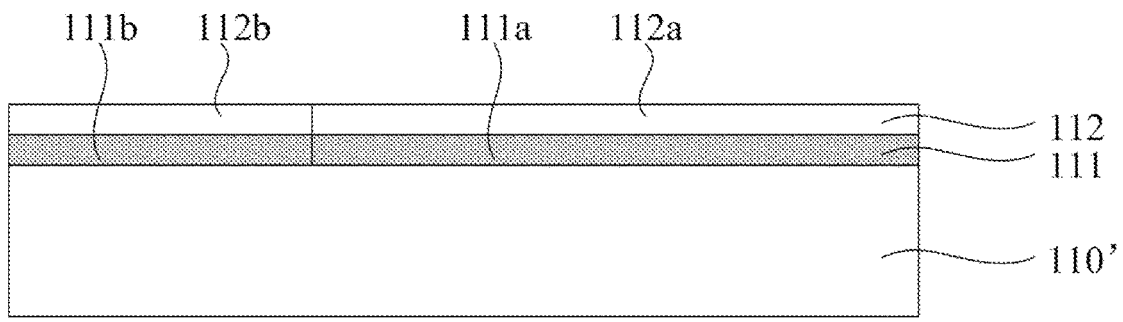
FIG. 9A to FIG. 9F illustrate schematic structural diagrams of a flow of manufacturing a display device according to an embodiment of the disclosure in sectional views.

Referring to FIG. 8 and FIG. 9A, the step S801 and the step S802 are performed, where the flexible thin film 111 is fabricated on the first substrate 110' to cover the first substrate entirely 110' and to include the first area 111*a* corresponding to the display area, and the second area 111*b*, on the first substrate 110', and the first circuit 112*a* is fabricated on the first area 111*a*, and the second circuit 112*b* is fabricated on the second area 111*b*, where the first circuit 112*a* and the second circuit 112*b* are fabricated at the same time, and the first circuit 112*a* and the second circuit 112*b* constitute a circuit 112. Referring to FIG. 9A, there is illustrated a schematic structural diagram of the substrate of the display panel including the flexible thin film 111 fabricated on the first substrate 110', and the first circuit 112*a* fabricated on the first area 111*a* and the second circuit 112*b* fabricated on the second area 111*b* of the flexible thin film 111, according to the embodiment of the disclosure in a sectional view.

Figure 9B:
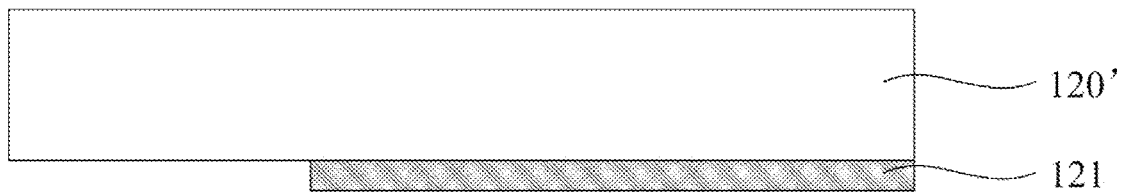

Referring to FIG. 8 and FIG. 9B, the step S803 is performed, where the second substrate 120' is prepared. More particularly in the method for fabricating a liquid crystal display panel according to this embodiment, after the second substrate 120' is prepared, display elements 121 are further fabricated on the second substrate 120', where the display elements 121 correspond to the display area, that is, the display elements 121 correspond to the first area 111*a* of the flexible thin film 111 on the first substrate 110'. More particularly the display elements 121 on the second substrate 120' are color filter films, black matrixes or other display elements. It shall be noted that this embodiment is only exemplary, but in other embodiments of the disclosure, when the display panel is prepared as another display panel, e.g., an organic light-emitting display panel, the display elements 121 may be organic light-emitting materials or other display elements. The disclosure will not be limited to the steps and structures described in this embodiment.

Figure 9C:
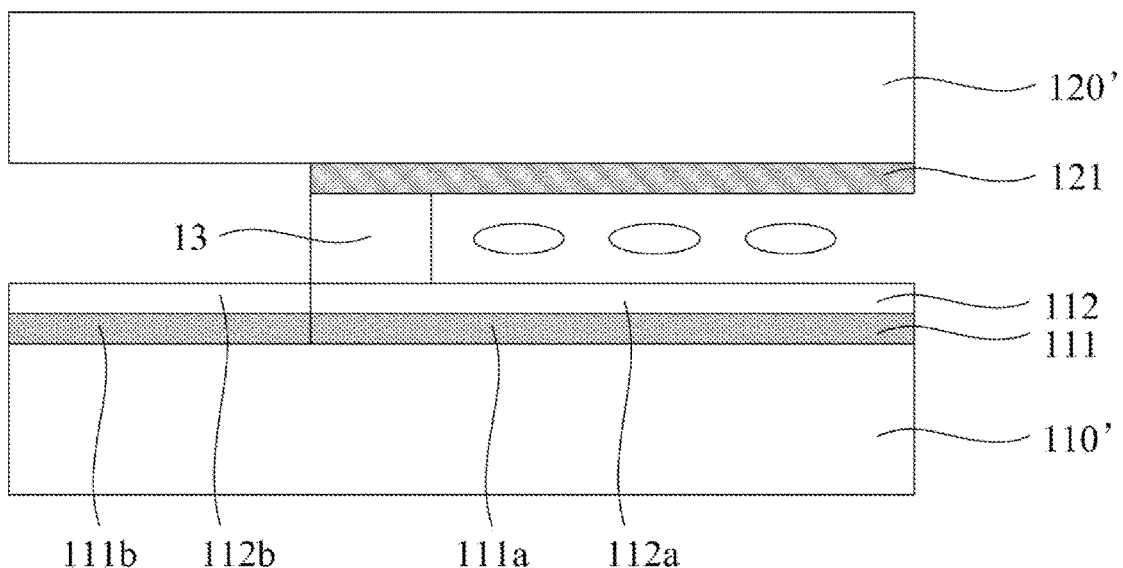

Referring to FIG. 8 and FIG. 9C, the step S804 is performed, where the sealing material 13 is disposed and aligned between the first substrate 110' and the second substrate 120' with the sealed area being the display area. More particularly the liquid crystal layer 14 is filled between the first substrate 110' and the second substrate 120'. Referring to FIG. 9B, there is illustrated a schematic structural diagram of the display panel including the sealing material 13 disposed between the first substrate 110' and the second substrate 120', and the liquid crystal layer 14 filled in the display area in which the sealing material is packaged, according to the embodiment of the disclosure in a sectional view.

Figure 9D:
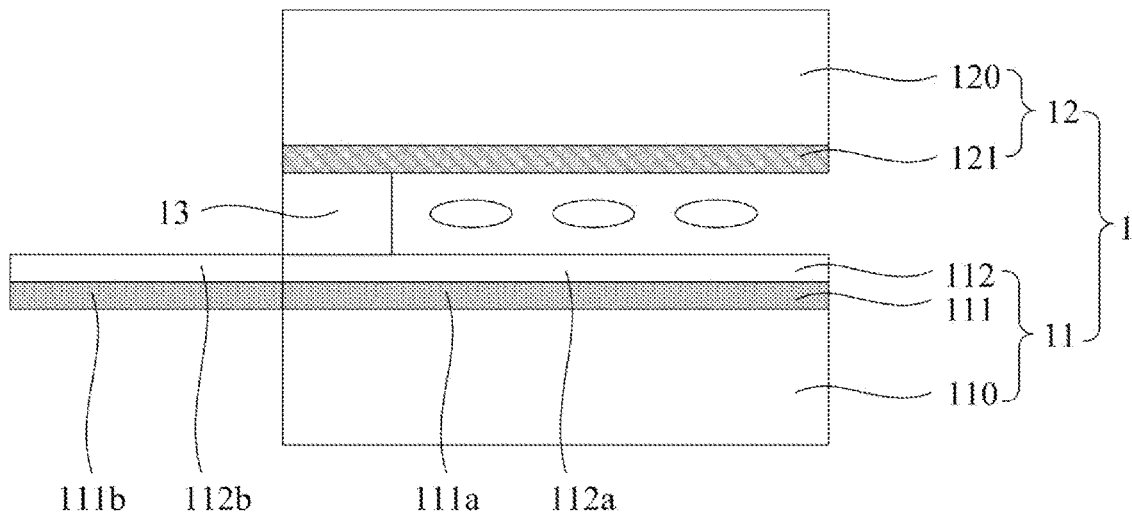

Referring to FIG. 8 and FIG. 9D, the step S805 is performed, where the excess parts of the first substrate 110' and the second substrate 120' are removed to obtain the first display substrate 11 and the opposite substrate 12. Particularly in the method for fabricating a liquid crystal display panel according to this embodiment, the first display substrate is an array substrate and the opposite substrate is a color filter substrate in this embodiment. Further to the structure of the display panel illustrated in FIG. 9C, the excess parts of the first substrate 110' and the second substrate 120' are removed to form the first display substrate 11, i.e., the array substrate, and the opposite substrate 12, i.e., the color filter substrate, the first display substrate 11 includes the substrate 110, and the flexible thin film 111 covering the entire substrate 110, the second area 111b of the flexible thin film 111 goes correspondingly beyond the area of the substrate 110, the excess part of the first substrate 110' is the first substrate 110' other than the substrate 110, and the excess part of the second substrate 120' is the second substrate 120' other than the opposite substrate 12.

Figure 9E:
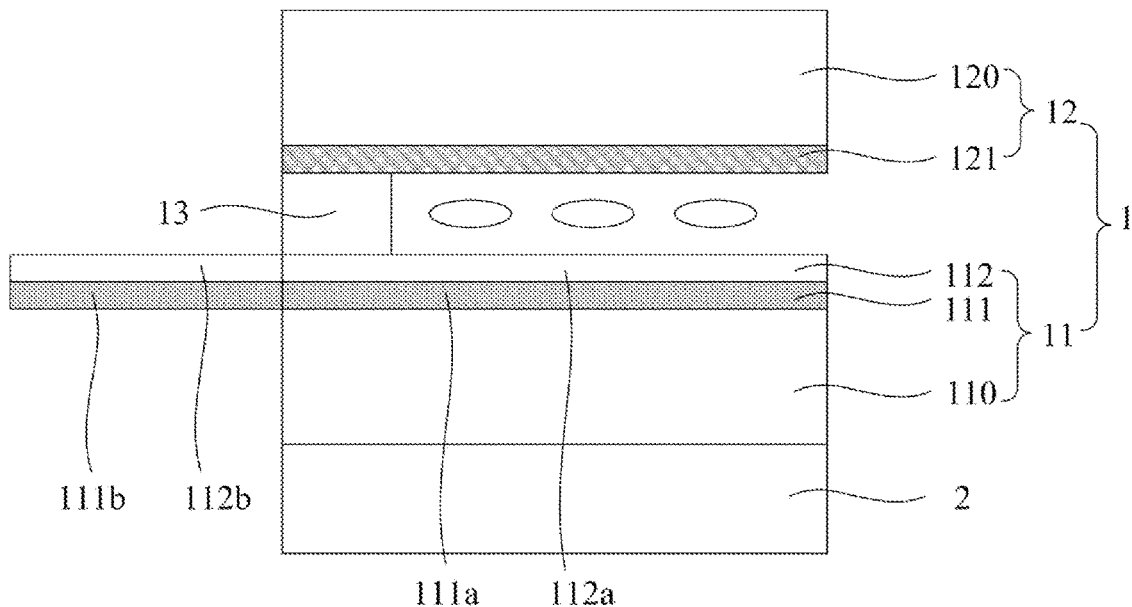

Referring to FIG. 8 and FIG. 9E, the step S806 is performed, where further to the structure of the display panel 1 illustrated in FIG. 9D, the backlight module 2 is disposed on the substrate 110 side of the first display substrate 11.

Figure 9F:
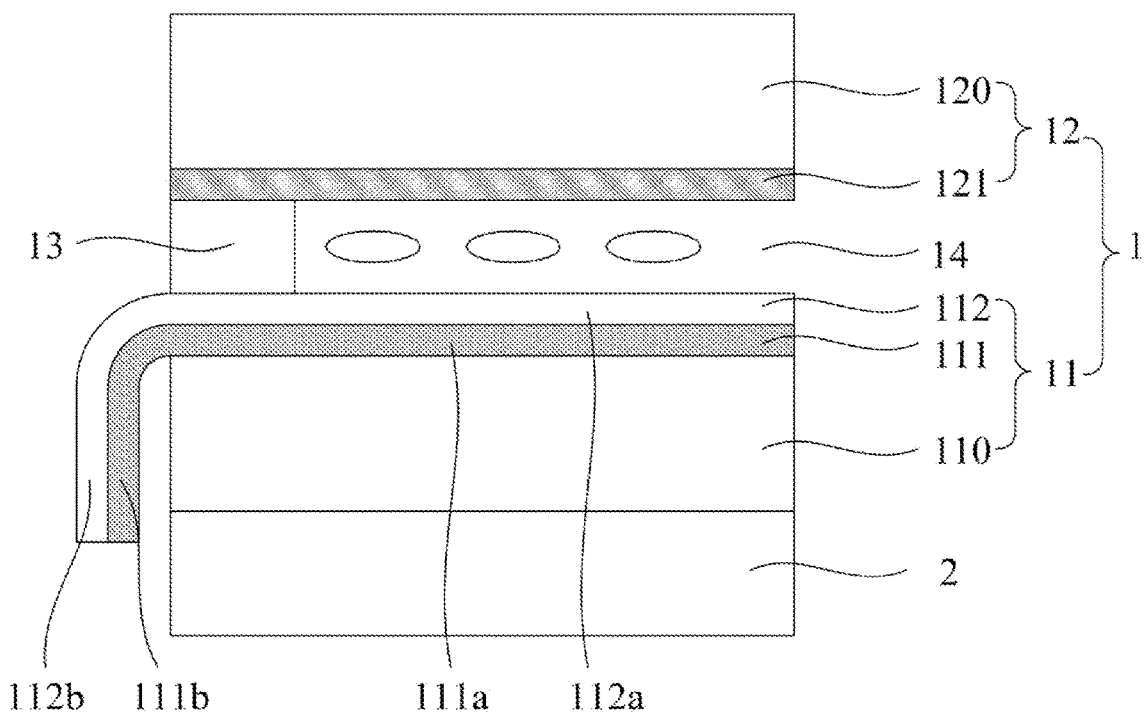

Further referring to FIG. 8 and FIG. 9F, the step S807 is preformed, after the backlight module 2 is disposed on the substrate 110 side of the first display substrate 11, the flexible thin film 111 in the second area 111b is bent, and the bent flexible thin film 111 in the second area 111b, the substrate 110 is fitted onto the sides of the first display substrate 11 and the backlight module 2.

Particularly the surface of the first display substrate 11 facing the opposite substrate 12 is a front surface, and the surface thereof away from the opposite substrate is a back surface. The backlight module 2 is disposed on the back surface of the first display substrate 11.

In the step S807, in order to decrease the width of a border of the liquid crystal display including the liquid crystal display panel 1 above, if the length of the flexible thin film 111 in the second area 111b goes beyond the thickness of the substrate 110 in the first display substrate 11 and the backlight module 2, then the part thereof beyond the thickness may be bent to be fitted onto the surface of the backlight module 2 away from the first display substrate 11.

After the step S807, in order to facilitate detection of a failure of the second circuit on the second area, the bent flexible thin film 111 in the second area 111b may further be fixed and protected, for example, the bent flexible thin film in the second area may be fixed by a transparent adhesive tape, a polyimide (PI) adhesive, etc. After the bent flexible thin film in the second area is fixed, the bent flexible thin film in the second area may further be protected by an Optic Clear (OC) adhesive, an ultraviolet cured adhesive, a thermally cured adhesive, etc. Particularly when the protected second circuit on the second area fails, if the bent flexible thin film in the second area is protected by an OC adhesive, then the failing circuit can be identified directly to thereby defect the failure.

The method for fabricating a display device according to the embodiment above includes the method for fabricating a display panel according to the embodiment above, where the display panel includes the first display substrate, and the opposite substrate, disposed opposite to each other, and the first display substrate includes the substrate, and the flexible thin film including the second area beyond the substrate; and the backlight module is disposed on the array substrate side of the display panel, so that the flexible thin film in the second area can be bent, and the bent flexible thin film in the second area can be fitted onto the sides of the first display substrate and the backlight module, such that the flexible thin film in the second area can be fitted onto the sides of the array substrate and the backlight module, and further the border of the liquid crystal display screen can be narrowed without being limited by the requisite size of the peripheral circuit, thus narrowing the border of the liquid crystal display screen and enlarging the liquid crystal display screen to thereby accommodate the consumer demand for a wider liquid crystal display screen. Moreover the bent flexible thin film in the second area can further be fixed and protected to thereby facilitate detection of a failure of the circuit on the second area.

Figure 10:
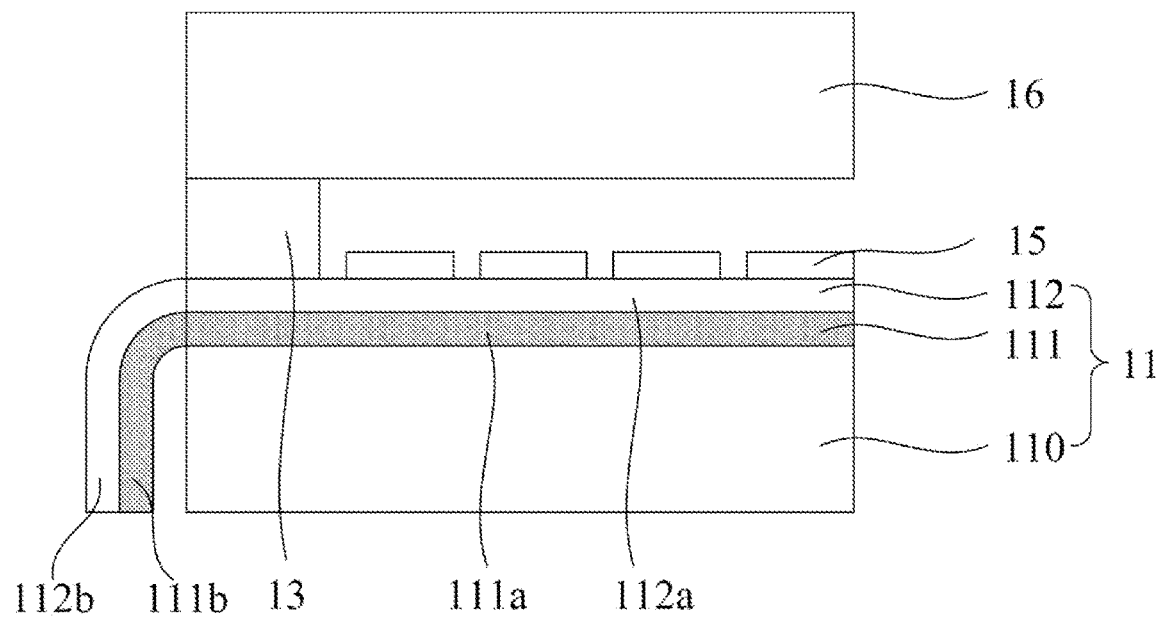
FIG. 10 illustrates a schematic structural diagram of another display panel according to an embodiment of the disclosure in a sectional view.

Further to the liquid crystal display panel according to the embodiment above, the disclosure further provides an embodiment of an organic light emitting display panel as follows:

FIG. 10 illustrates a schematic structural diagram of another display panel according to an embodiment of the disclosure in a sectional view.

As illustrated in FIG. 10, the display panel may include a first display substrate 11, where the first display substrate 11 includes a substrate 110 and a flexible thin film 111. The flexible thin film 111 includes a first area 111a covering the substrate 110 entirely, and a second area 111b beyond the substrate 110. A first circuit 112a is disposed on the first area 111a, and a second circuit 112b is disposed on the second area 111b. The first circuit 112a and the second circuit 112b constitutes circuit 112, wherein the first circuit 112a disposed on the first area 111a is a pixel circuit, and the second circuit 112b disposed on the second area 111b is a peripheral circuit. Particularly the pixel circuit disposed on the first area 111a is an array of pixels. The peripheral circuit disposed on the second area 111b may be a Gate Driving Circuit, an electrode wire circuit, or an integrated control circuit.

As illustrated in FIG. 10, the display panel further includes a cover plate 16, which is disposed opposite to the first area 111a, and is aligned on the first display substrate 11 with a sealing material 13. The area sealed by the sealing material 13 is the display area and particularly, the sealing material 13 may be frit sealing material. And, an organic light emitting material 15 could be disposed between the flexible thin film 111 and the cover plate 16. Particularly, an anode and a cathode may be disposed respectively on each side of the organic light emitting material 15. The cathode may be disposed particularly between the organic light emitting material 15 and the cover plate 16, which is not illustrated in FIG. 10. Under the control of the pixel circuit, the organic light emitting material 15 could emit light by itself. The organic light emitting material 15 is arranged in array, corresponding to the pixel circuit, and could display with different driving currents.

In order to decrease the width of a display device including the display panel above to thereby narrow the border of the display including the display panel above, the flexible thin film in the second area 111b is bent towards the side of substrate 110 to be fitted onto the side of substrate 110. However, the disclosure is not limited to this. In some other embodiments of the disclosure, the flexible thin film in the second area 111b may be bent towards the side of the cover plate to be fitted onto the side of the cover plate. When the flexible thin film in the second area 111b is bent towards the side of the substrate 110 and goes beyond the side of the substrate 110, it could further be bent to the back of the substrate 110, i.e. the side of the substrate 110 which is on the opposite of the side where the flexible thin film is, to fit onto the back of the substrate 110.

Preferably, in order to facilitate fabrication of the pixel circuit and the peripheral circuit on the first display substrate 11, the transmissivity of the flexible film is higher than 90% and the highest endurable temperature thereof is not lower than 200° C.

Figure 11:
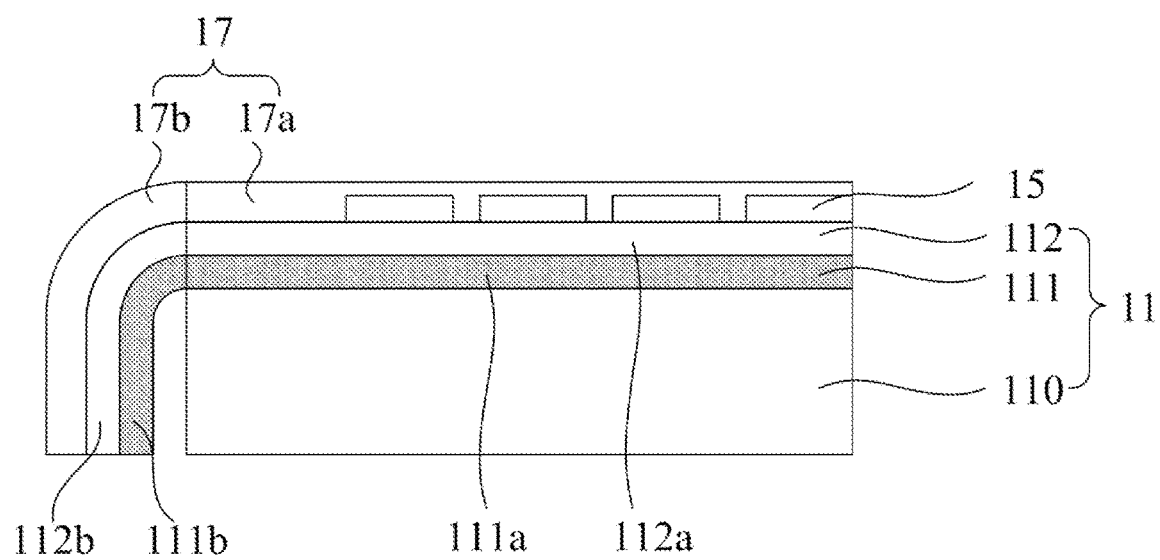
FIG. 11 illustrates a schematic structural diagram of another display panel according to an embodiment of the disclosure in a sectional view.

Based upon the organic light emitting display panel sealed by a cap substrate according to the embodiment above, the disclosure further provides an embodiment of another organic light emitting display panel as follows:

FIG. 11 illustrates a schematic structural diagram of another display panel according to an embodiment of the disclosure in a sectional view.

As illustrated in FIG. 11, the display panel may include a first display substrate 11, which includes a substrate 110 and a flexible thin film 111. The flexible thin film 111 includes a first area 111a covering the substrate 110 entirely, and a second area 111b beyond the substrate 110. A first circuit 112a is disposed on the first area 111a, and a second circuit 112b is disposed on the second area 111b. The first circuit 112a and the second circuit 112b constitutes circuit 112, wherein the first circuit 112a disposed on the first area 111a is a pixel circuit, and the second circuit 112b disposed on the second area 111b is a peripheral circuit. Particularly, the pixel circuit disposed on the first area 111a is an array of pixels. The peripheral circuit disposed on the second area 111b may be a Gate Driving Circuit, an electrode wire circuit, or an integrated control circuit.

Further, as illustrated in FIG. 11, the display panel includes thin film encapsulation layer 17, which covers the flexible thin film 111. The first circuit 112a and the second circuit 112b are disposed between the thin film encapsulation layer 17 and the flexible thin film 111. The thin film encapsulation layer 17 particularly includes a first part 17a covering the first area 111a and a second part 17b covering the second area 111b. Particularly, multiple organic layers and non-organic layers are stacked to constitute the thin film encapsulation layer 17. Also, organic light emitting materials 15 could be disposed between the second circuit 112b and the thin film encapsulation layer 17. Particularly, an cathode and an anode may be disposed respectively on each side of the organic light emitting material 15, wherein the cathode is particularly disposed between the organic light emitting material 15 and the thin film encapsulation layer 17, which is not illustrated in FIG. 11. Under the control of the pixel circuit, the organic light emitting material 15 could emit light by itself. The organic light emitting material 15 is arranged in array, corresponding to the pixel circuit, and could display with different driving currents.

In order to decrease the width of a display device including the display panel above to thereby narrow the border of the display device including the display panel above, the flexible thin film in the second area 111b is bent towards the side of substrate 110 to be fitted onto the side of substrate 110. When the flexible thin film in the second area 111b is bent towards the side of the substrate 110 and goes beyond the side of the substrate 110, it could further be bent to the back of the substrate 110, i.e. the side of the substrate 110 which is on the opposite of the side where the flexible thin film is, to fit onto the back of the substrate 110.

Preferably, in order to facilitate fabrication of the pixel circuit and the peripheral circuit on the first display substrate 11, the transmissivity of the flexible film is higher than 90% and the highest endurable temperature thereof is not lower than 200° C.

The organic light emitting display panel according to the embodiment above includes a first display substrate, which includes a substrate, and a flexible thin film including a first area covering the substrate entirely, and a second area beyond the substrate. A first circuit is disposed on the first area, and a second circuit is disposed on the second area. The first display substrate is covered with a flexible thin film, so that the second circuit on the flexible thin film can be bent, and further the border of the display screen can be narrowed without being limited by the requisite size of the peripheral circuit, thus narrowing the border of the display screen and enlarging the display screen to thereby accommodate the consumer demand for a wider display screen. In the meanwhile, the peripheral circuit can further be made larger to thereby improve the charging effect and improve the yield of the product. Moreover the bent flexible thin film in the second area can further be fixed and protected to thereby facilitate detection of a failure of the circuit in the second area.

Based upon the same technical idea, an embodiment of the disclosure provides a method for manufacturing a display panel, which can be applicable to manufacturing of the organic light emitting display panel sealed by a cap substrate according to the embodiment above.

Figure 12:
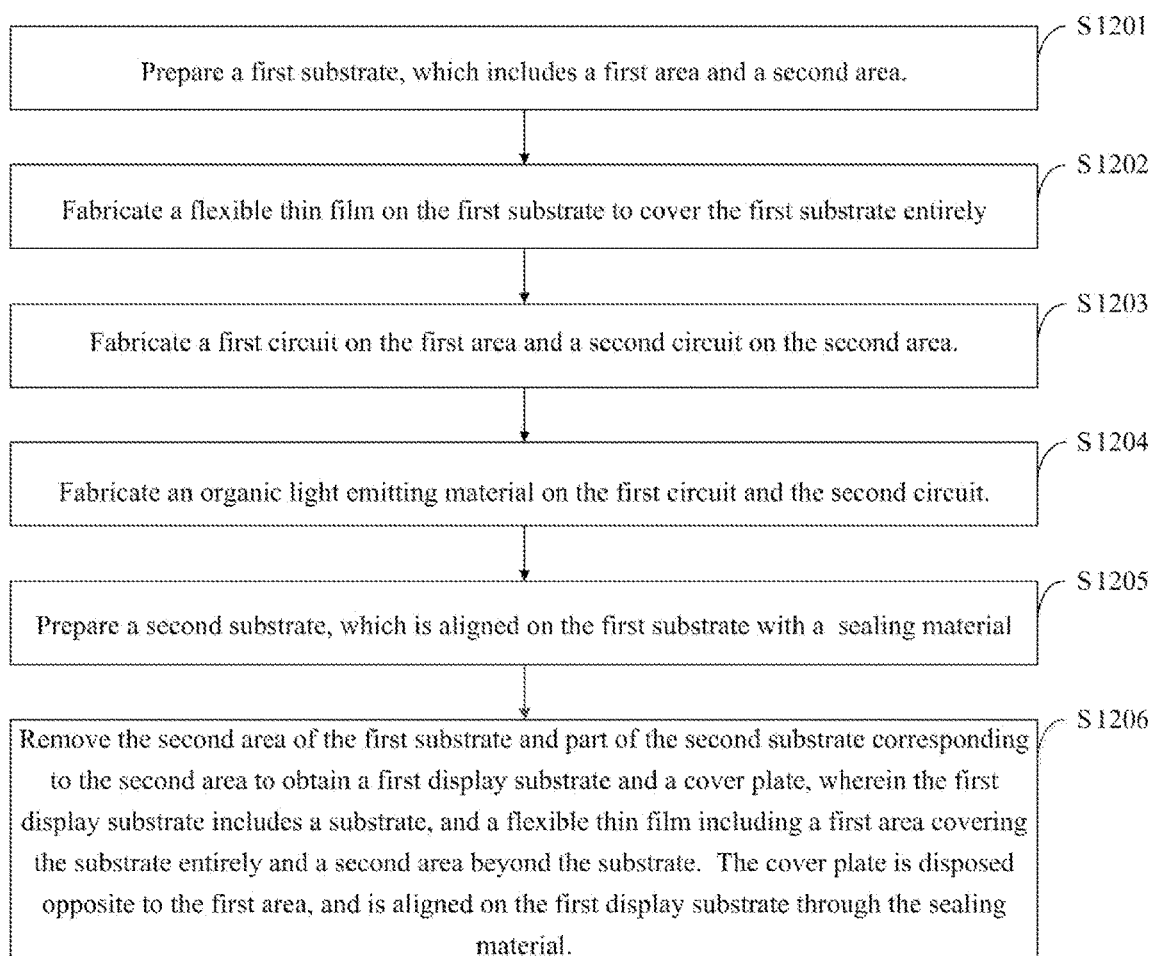
FIG. 12 illustrates a flow chart of another method for manufacturing a display panel according to an embodiment of the disclosure.

FIG. 12 illustrates a flow chart of a method for manufacturing an organic light emitting display panel according to an embodiment of the disclosure, and FIG. 13A to FIG. 13E illustrate schematic structural diagrams during the flow of manufacturing an organic light emitting display panel according to an embodiment of the disclosure in sectional view. Referring to FIG. 12 and FIG. 13A to FIG. 13E, the method may include:

S1201 is to prepare a first substrate, which includes a first area and a second area.

S1202 is to fabricate a flexible thin film on the first substrate to cover the first substrate entirely, i.e., cover the first area and the second area of the first substrate.

S1203 is to fabricate a first circuit on the first area and a second circuit on the second area.

S1204 is to fabricate an organic light emitting material on the first circuit and the second circuit.

S1205 is to prepare a second substrate, which is aligned on the first substrate with a sealing material.

S1206 is to remove the second area of the first substrate and part of the second substrate corresponding to the second area to obtain a first display substrate and a cover plate, wherein the first display substrate includes a substrate, and a flexible thin film including a first area covering the substrate entirely and a second area beyond the substrate. The cover plate is disposed opposite to the first area of the flexible thin film, and is aligned on the first display substrate with the sealing material.

Particularly in order to facilitate fabrication of the pixel circuit and the peripheral circuit on the substrate, when fabricating the flexible thin film on the first substrate in the step 1202, the transmissivity of the flexible thin film is higher than 90% and the highest endurable temperature thereof is not lower than 200° C.

Figure 13A:
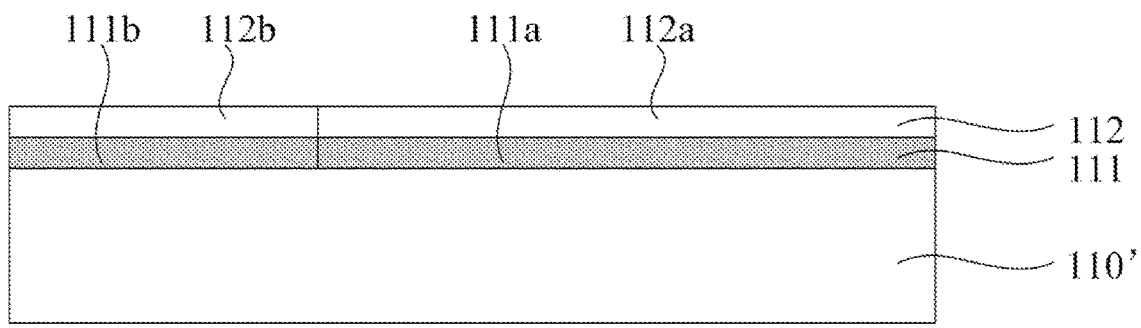
FIG. 13A to FIG. 13E illustrate schematic structural diagrams during the flow of manufacturing a display panel according to an embodiment of the disclosure in sectional views.

Referring to FIG. 12 and FIG. 13A, the step S1202 and the step 1203 are performed, where the flexible thin film 111 is fabricated on the first substrate 110' to cover the first substrate 110' entirely, wherein the flexible thin film 111 includes the first area 111a corresponding to the display area, and the second area 111b, both on the first substrate 110', and the first circuit 112a is fabricated on the first area 111a, and the second circuit 112b is fabricated on the second area 111b, where the first circuit 112a and the second circuit 112b are fabricated at the same time, and the first circuit 112a and the second circuit 112b constitute a circuit 112. Referring to FIG. 13A, it illustrates a schematic structural diagram of the substrate of the display panel including the flexible thin film 111 fabricated on the first substrate 110', and the first circuit 112a fabricated on the first area 111a and the second circuit 112b fabricated on the second area 111b of the flexible thin film 111, according to the embodiment of the disclosure in a sectional view.

Figure 13B:
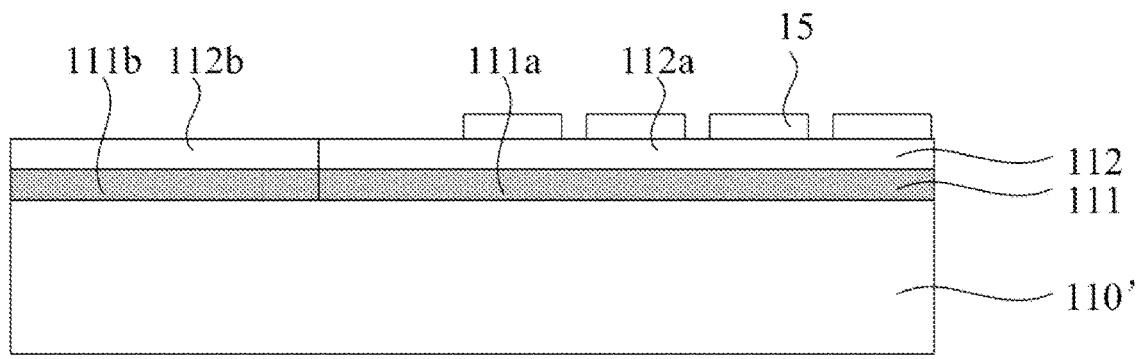

Referring to FIG. 12 and FIG. 13B, the step S1204 is performed, here the organic light emitting material 15 is formed on the first circuit 112a and the second circuit 112b, wherein the organic light emitting material 15 may be fabricated only on the first circuit 112a. Also, an anode and a cathode may be disposed respectively on each side of the organic light emitting material 15. For example, before fabricating the organic light emitting material 15, a cathode may be formed on the first circuit 112a and the second circuit 112b, then forming the organic light emitting material 15, which is not illustrated in the figures. Under the control of the pixel circuit, the organic light emitting material 15 could emit light by itself. The organic light emitting material 15 is arranged in array, corresponding to the pixel circuit, and could display with different driving currents. Referring to FIG. 13B, it illustrates a schematic structural diagram of the substrate of the display panel including the organic light emitting material 15 formed on the first circuit 112a and the second circuit 112b, according to the embodiment of the disclosure in a sectional view.

Figure 13C:
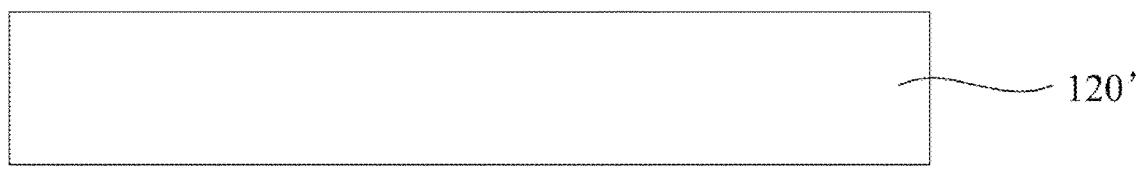
Figure 13D:
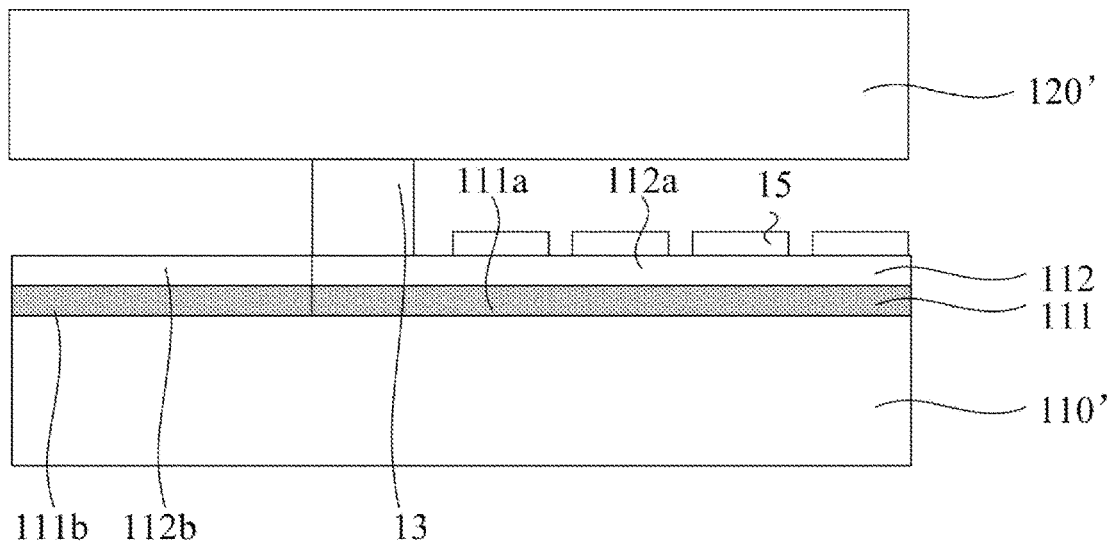

Referring to FIG. 12, FIG. 13C and FIG. 13D, the step 1205 is performed, where the second substrate 120' is prepared. The second substrate 120' is aligned on the first display substrate 110 with a sealing material 13, wherein the area sealed by the sealing material 13 is the display area. Also referring to FIG. 13C, it illustrates a schematic structural diagram of the display panel including the second substrate 120', according to the embodiment of the disclosure in a sectional view. Referring to FIG. 13D, there is a schematic structural diagram of the display panel including the second substrate 120' aligned on the first display substrate 110 with a sealing material 13, according to the embodiment of the disclosure in a sectional view.

Figure 13E:
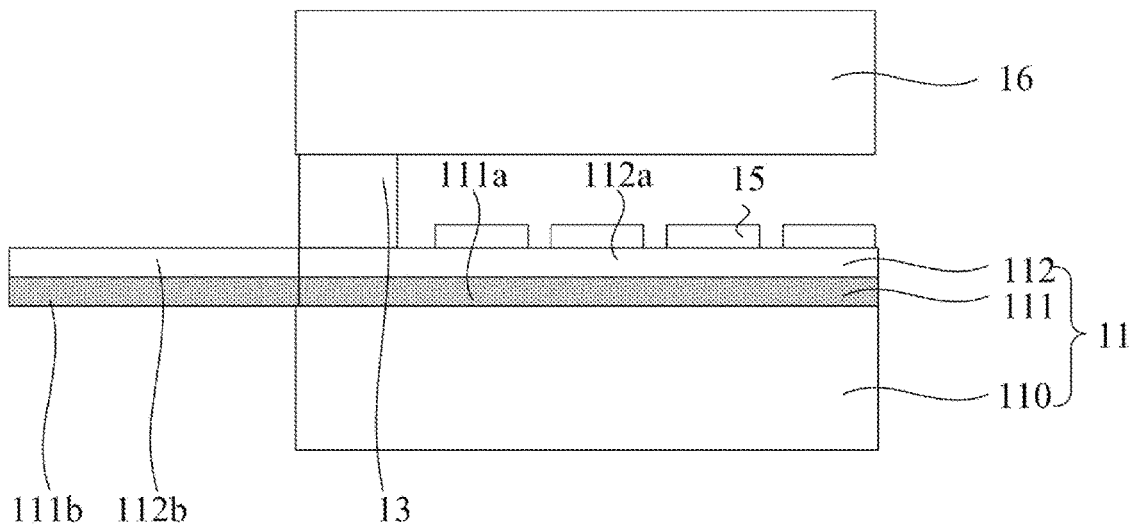

Referring to FIG. 12 and FIG. 13E, the step S1206 is performed, where excess part of the first substrate and excess part of the second substrate are removed to obtain the first display substrate and the cover plate. Particularly, on the basis of the structure of the display panel illustrated in FIG. 13D, part of the first substrate 110' corresponding to the second area and part of the second substrate 120' corresponding to the second area are removed to form the first display substrate 11 and the cover plate 16. The first display substrate 11 includes the substrate 110 and the flexible thin film 111, where the flexible thin film 111 includes the first area 111a covering the substrate 110 entirely and the second area 111b beyond the substrate 110. The excess part of the first substrate 110' is the first substrate 110' other than the substrate 110, and the excess part of the second substrate 120' is the second substrate 120' other than the cover plate 16.

In order to decrease the width of a border of a display device including the display panel above to thereby narrow the border of the display device including the display panel above, after the part of the first substrate 110' corresponding to the second area is removed, and the first display substrate 11 is obtained, the flexible thin film 111 in the second area 111b may be bent towards the substrate 110 to be fitted onto the side of the substrate 110, i.e., the side where the side of the first display panel 11 is located on.

More particularly, in the step S1203, when the first circuit 112a is fabricated on the first area 111a, and the second circuit 112b is fabricated on the second area 111b, the first circuit 112a is an array of pixels, and the second circuit 112b is a peripheral circuit which may be a Gate Driving Circuit or may be an electrode wire circuit or an integrated control circuit. Additionally, in order to avoid a degraded characteristic of the flexible thin film, the first circuit and the second circuit shall be fabricated at temperature no higher than the highest endurable temperature of the flexible thin film.

In order to facilitate detection of a failure, the bent flexible thin film in the second area may further be fixed and protected, for example, the bent flexible thin film in the second area may be fixed by a transparent adhesive tape, a polyimide (PI) adhesive, etc. After the bent flexible thin film in the second area is fixed, the bent flexible thin film in the second area may further be protected by an Optic Clear (OC) adhesive, an ultraviolet cured adhesive, a thermally cured adhesive, etc. Particularly when the protected second circuit on the second area fails, if the bent flexible thin film in the second area is protected by an OC adhesive, then the faulty circuit can be identified via direct observation to thereby defect the failure.

Based upon the same technical idea, an embodiment of the disclosure provides another method for manufacturing a display panel, which can be applicable to manufacturing the organic light emitting display panel sealed by a thin film according to the embodiment above.

Figure 14:
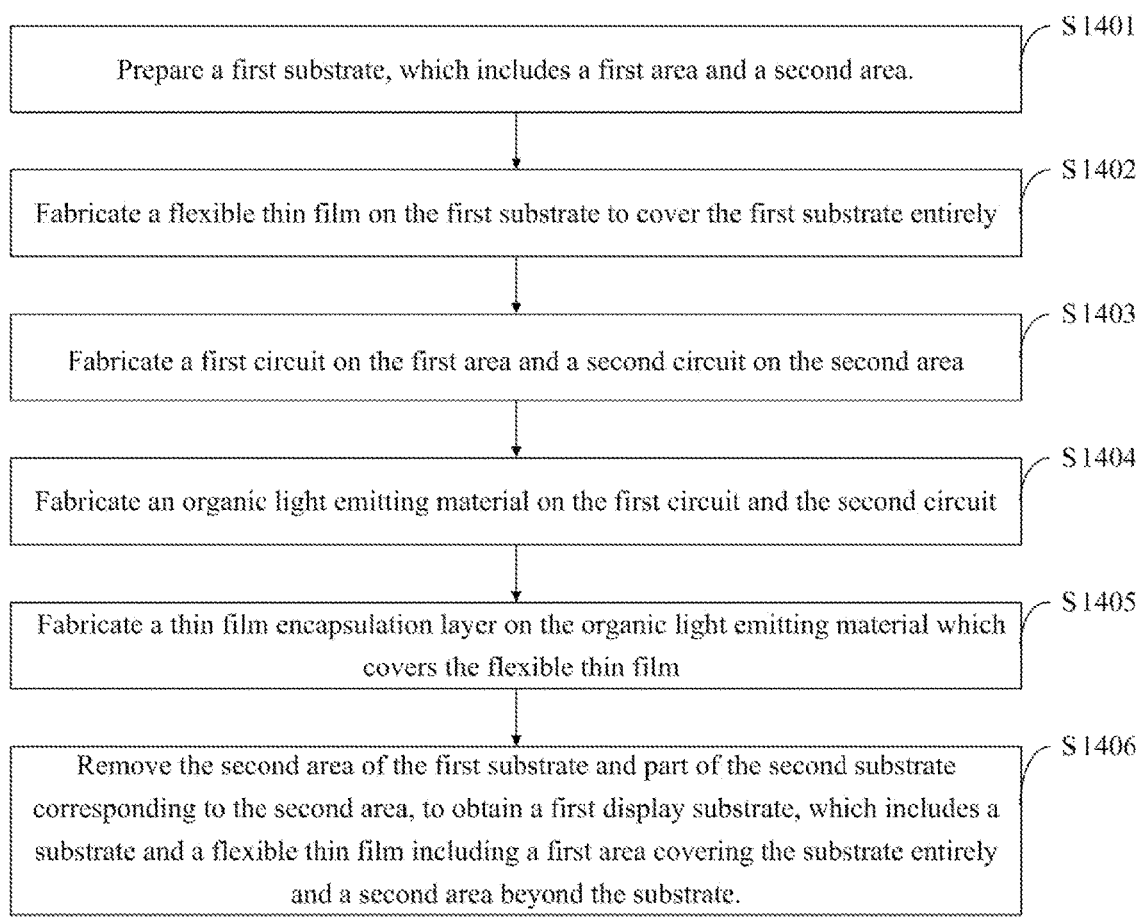
FIG. 14 illustrates a flow chart of another method for manufacturing a display panel according to an embodiment of the disclosure.

FIG. 14 illustrates a flow chart of a method for manufacturing an organic light emitting display panel according to an embodiment of the disclosure, and FIG. 15A to FIG. 15E illustrate schematic structural diagrams during the flow of manufacturing an organic light emitting display panel according to an embodiment of the disclosure in sectional view. Referring to FIG. 14 and FIG. 15A to FIG. 15E, the method may include:

S1401 is to prepare a first substrate, which includes a first area and a second area.

S1402 is to fabricate a flexible thin film on the first substrate to cover the first substrate entirely, i.e., cover the first area and the second area of the first substrate.

S1403 is to fabricate a first circuit on the first area and a second circuit on the second area.

S1404 is to fabricate an organic light emitting material on the first circuit and the second circuit.

S1405 is to fabricate a thin film encapsulation layer on the organic light emitting material, which covers the flexible thin film.

S1406 is to remove the second area of the first substrate and part of the second substrate corresponding to the second area, to obtain a first display substrate, which includes a substrate and a flexible thin film including a first area covering the substrate entirely and a second area beyond the substrate.

Particularly in order to facilitate fabrication of the pixel circuit and the peripheral circuit on the substrate, when fabricating the flexible thin film on the first substrate in the step 1402, the transmissivity of the flexible thin film is higher than 90% and the highest endurable temperature thereof is not lower than 200° C.

Figure 15A:
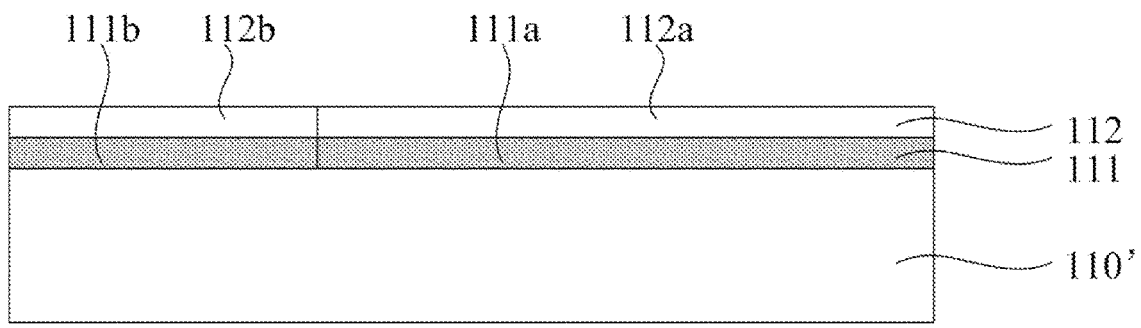
FIG. 15A to FIG. 15D illustrate schematic structural diagrams during the flow of manufacturing a display panel according to an embodiment of the disclosure in sectional views.

Referring to FIG. 14 and FIG. 15A, the step S1402 and the step 1403 are performed, where the flexible thin film 111 is fabricated on the first substrate 110' to cover the first substrate 110' entirely, where the flexible thin film 111 includes the first area 111a corresponding to the display area, and the second area 111b, on the first substrate 110', and the first circuit 112a is fabricated on the first area 111a, and the second circuit 112b is fabricated on the second area 111b, where the first circuit 112a and the second circuit 112b are fabricated at the same time, and the first circuit 112a and the second circuit 112b constitute a circuit 112. Referring to FIG. 15A, it illustrates a schematic structural diagram of the substrate of the display panel including the flexible thin film 111 fabricated on the first substrate 110', and the first circuit 112a fabricated on the first area 111a and the second circuit 112b fabricated on the second area 111b of the flexible thin film 111, according to the embodiment of the disclosure in a sectional view.

Figure 15B:
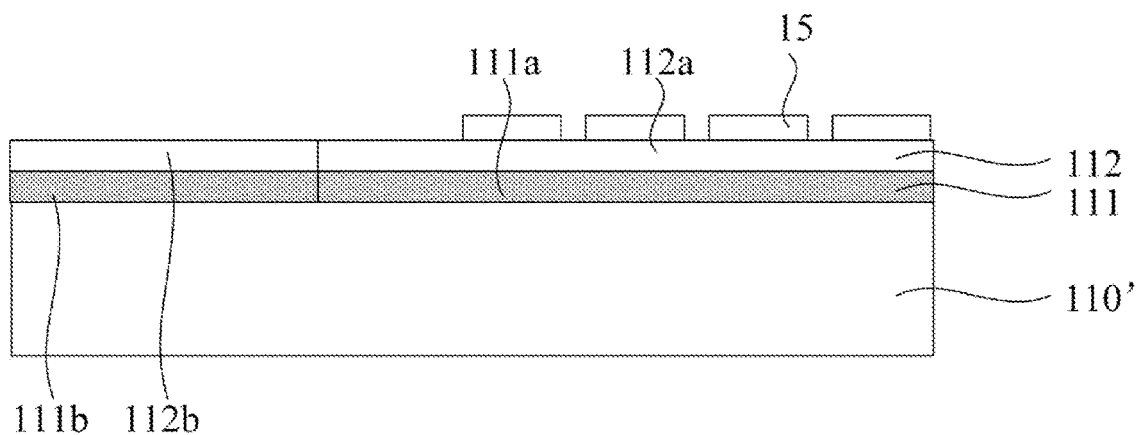

Referring to FIG. 14 and FIG. 15B, the step S1404 is performed, where the organic light emitting material 15 is fabricated on the first circuit 112a and the second circuit 112b, wherein the organic light emitting material 15 may be fabricated only on the first circuit 112a. Also, an anode and a cathode may be disposed respectively on each side of the organic light emitting material 15. For example, before fabricating the organic light emitting material 15, a cathode may be formed on the first circuit 112a and the second circuit 112b, then fabricating the organic light emitting material 15, which is not illustrated in the figures. Under the control of the pixel circuit, the organic light emitting material 15 could emit light by itself. The organic light emitting material 15 is arranged in array, corresponding to the pixel circuit, and could display with different driving currents. Referring to FIG. 15B, it illustrates a schematic structural diagram of the substrate of the display panel including the organic light emitting material 15 fabricated on the first circuit 112a and the second circuit 112b, according to the embodiment of the disclosure in a sectional view.

Figure 15C:
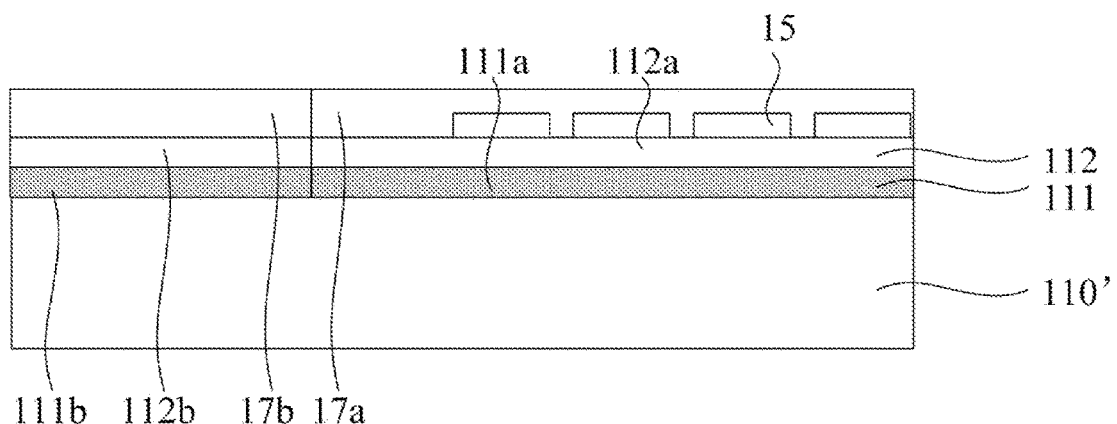

Referring to FIG. 14 and FIG. 15C, the step 1405 is performed, where the thin film encapsulation layer 17 is fabricated on the organic light emitting material 15. The thin film encapsulation layer 17 covers the flexible thin film 111 and particularly includes the first part 17a covering the first area 111a and the second part 17b covering the second area 111b. Particularly, multiple organic layers and non-organic layers are stacked to constitute the thin film encapsulation layer 17. Referring to FIG. 15C, it illustrates a schematic structural diagram of the display panel including the thin film encapsulation layer 17 fabricated on the organic light emitting material 15, according to the embodiment of the disclosure in a sectional view.

Figure 15D:
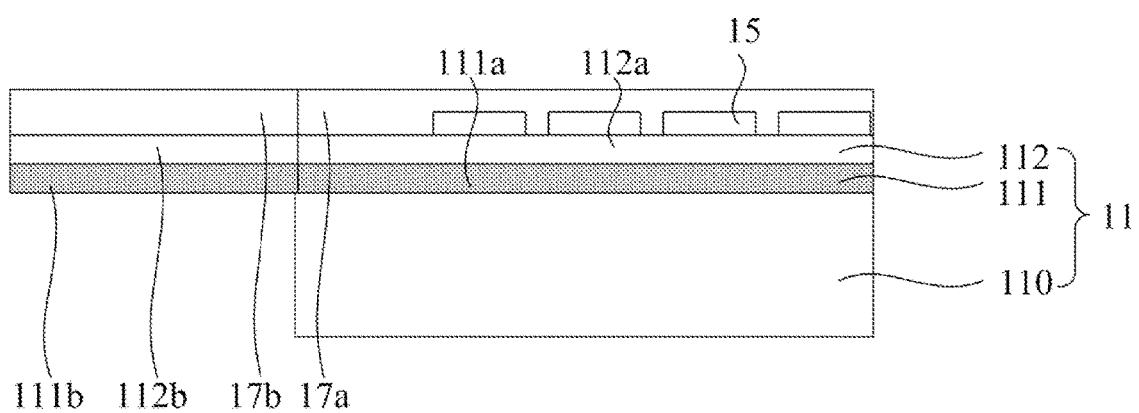

Referring to FIG. 14 and FIG. 15D, the step S1406 is performed, where the excess part of the first substrate are removed to obtain the first display substrate. Particularly, on the basis of the structure of the display panel illustrated in FIG. 15C, the part of the first substrate 110' corresponding to the second area are removed to fabricate the first display substrate 11. The first display substrate 11 includes the substrate 110 and the flexible thin film 111, which includes the first area 111a covering the substrate 110 entirely and the second area 111b beyond the substrate 110. The excess part of the first substrate 110' is the first substrate 110' other than the substrate 110.

In order to decrease the width of a border of a display device including the display panel above to thereby narrow the border of the display including the display panel above, after the part of the first substrate 110' corresponding to the second area are removed, and the first display substrate 11 is obtained, the flexible thin film 111 in the second area 111b may be bent towards the substrate 110 to be fitted onto the side of the substrate 110, i.e., the same side where the side of the first display panel 11 is located on.

More particularly in the step S1403, when the first circuit 112a is fabricated on the first area 111a, and the second circuit 112b is fabricated on the second area 111b, the first circuit 112a is an array of pixels, and the second circuit 112b is a peripheral circuit which may be a Gate Driving Circuit or may be an electrode wire circuit or an integrated control circuit. Additionally, in order to avoid a degraded characteristic of the flexible thin film, the first circuit and the second circuit shall be fabricated at temperature no higher than the highest endurable temperature of the flexible thin film.

In order to facilitate detection of a failure, the bent flexible thin film in the second area may further be fixed and protected, for example, the bent flexible thin film in the second area may be fixed by a transparent adhesive tape, a PI adhesive, etc. After the bent flexible thin film in the second area is fixed, the bent flexible thin film in the second area may further be protected by an OC adhesive, an ultraviolet cured adhesive, a thermally cured adhesive, etc. Particularly when the protected second circuit on the second area fails, if the bent flexible thin film in the second area is protected by an OC adhesive, then the faulty circuit can be identified via direct observation to thereby defect the failure.

The method for fabricating the organic light emitting display panel according to this embodiment includes: fabricating a flexible thin film on a first substrate to cover the first substrate entirely, i.e., cover a first area corresponding to a display area, and a second area, of the first substrate; fabricating a first circuit on the first area; fabricating a second circuit on the second area; and removing excess part of the first substrate to obtain a first display substrate, where the first display substrate includes a substrate and the flexible thin film including a first area covering the substrate entirely and a second area corresponding to area beyond the area of the substrate, so that the second circuit on the second area of the flexible thin film may be bent, and further the border of the display screen can be narrowed without being limited by the requisite size of the peripheral circuit, thus narrowing the border of the display screen and improve the ratio in area of the display panel to thereby accommodate the consumer demand for a wider display screen. Moreover the bent flexible thin film in the second area can further be fixed and protected to thereby facilitate detection of a failure of the circuit on the second area.

Although the preferred embodiments of the disclosure have been described, those skilled in the art benefiting from the underlying inventive concept may make additional modifications and variations to these embodiments. Therefore the appended claims are intended to be construed as encompassing the preferred embodiments and all the modifications and variations coming into the scope of the disclosure.

Evidently those skilled in the art may make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:
1. A display panel, comprising:
a first display substrate, wherein the first display substrate comprises a substrate and a flexible thin film, and wherein the flexible thin film comprises:
a first area covering a top surface of the substrate up to an edge;
a second area extending from the first area to cover a side surface of the substrate;
a first circuit disposed on the first area, wherein the first circuit comprises a pixel circuit;
a second circuit disposed on the second area; and a thin film encapsulation layer covering the first and second circuits;

wherein an organic light emitting material layer is disposed between the thin film encapsulation layer and the first and second circuits respectively; and wherein the substrate of the first display substrate comprises four edges around the substrate and a step; except for an edge where the step is located, the edges are aligned with outer edges of the first area; and at least one connection terminal connecting an external circuit is disposed on the step.

2. The display panel according to claim 1, wherein:
the second area in the flexible thin film adheres to the side surface of the substrate.

3. The display panel according to claim 1, further comprising:
a cover plate;
wherein the cover plate is disposed opposite to the first area of the flexible thin film.

4. The display panel according to claim 3, wherein the second area of the flexible thin film is bent.

5. The display panel according to claim 1, wherein transmissivity of the flexible thin film is greater than 90%, and a highest endurable temperature of the flexible thin film is not less than 200° C.

6. The display panel according to claim 1, wherein the second circuit comprises a peripheral circuit.

7. The display according to claim 6, wherein the peripheral circuit comprises at least one of a gate driving circuit, an electrode wire circuit, and an integrated control circuit.

8. The display panel according to claim 1, further comprising a sealing material layer disposed at the edge of the substrate, wherein the sealing material layer has a frit sealing material.

9. A method for manufacturing a display panel, the method comprising:

preparing a first substrate, the first substrate comprising a substrate comprising four edges around the substrate and a step;

fabricating a flexible thin film on the first substrate extending from a top surface to a side surface of the first substrate, wherein the flexible thin film includes a first area and a second area, and the first area covers the top surface of the substrate up to an edge; wherein, except for one edge of the substrate where the step is located, the edges of the substrate are aligned with outer edges of the first area, and at least one connection terminal connecting an external circuit is disposed on the step;

fabricating a first circuit on the first area, the first circuit comprising a pixel circuit;

fabricating a second circuit on the second area;

depositing an organic light emitting material layer on the first and second circuits; and fabricating a thin film encapsulation layer on the organic light emitting material, wherein the thin film encapsulation layer covers the flexible thin film.

10. The method according to claim 9, further comprising:
preparing a second substrate opposite to the first substrate;
removing the second area of the flexible thin firm to obtain a first display substrate; and
preparing the second substrate as a cover plate aligned to the first area.

11. The method according to claim 9, further comprising:
bending the flexible thin film to adhere to the side surface of the first substrate.

12. A display panel, comprising:
a first display substrate,
an opposite substrate, and
a sealing material disposed between the first display substrate and the opposite substrate, wherein an area sealed by the sealing material is a display area;

wherein the first display substrate comprises a substrate and a flexible thin film;

wherein the flexible thin film comprises a first area covering a top surface of the substrate up to an edge, and a second area extending from the first area to cover a side surface of the substrate; wherein, a first circuit is disposed on the first area, and a second circuit is disposed on the second area;

the flexible thin film in the second area is bent to be fitted onto the side of the display panel and be fixed on the display panel; and the bent flexible thin film in the second area is protected by an Optic Clear adhesive, an ultraviolet cured adhesive, or a thermally cured adhesive; and wherein the substrate of the first display substrate comprises four edges around the substrate and a step; except an edge where the step is located, the edges are aligned with outer edges of the sealing material; and at least one connection terminal connecting an external circuit is disposed on the step.

13. The display panel according to claim 12, wherein the sealing material is frit sealing material.

* * * * *